(12) United States Patent
Sadatomi et al.

(10) Patent No.: US 7,002,071 B1
(45) Date of Patent: Feb. 21, 2006

(54) THERMOELECTRIC CONVERSION MATERIAL AND METHOD OF PRODUCING THE SAME

(75) Inventors: Nobuhiro Sadatomi, Ibaraki (JP); Osamu Yamashita, Ibaraki (JP); Tsunekazu Saigo, Matsubara (JP); Masao Noumi, Kawanishi (JP)

(73) Assignee: Sumitomo Special Metals Co. Ltd., Osaka (JP)

(*) Notice: Subject to any disclaimer, the term of this patent is extended or adjusted under 35 U.S.C. 154(b) by 0 days.

(21) Appl. No.: 09/674,978

(22) PCT Filed: Mar. 10, 2000

(86) PCT No.: PCT/JP00/01469

§ 371 (c)(1),
(2), (4) Date: Nov. 8, 2000

(87) PCT Pub. No.: WO00/54343

PCT Pub. Date: Sep. 14, 2000

(30) Foreign Application Priority Data

| Mar. 10, 1999 | (JP) | 11-063074 |
| Mar. 10, 1999 | (JP) | 11-063088 |
| Mar. 10, 1999 | (JP) | 11-063093 |
| Mar. 10, 1999 | (JP) | 11-063099 |
| Aug. 30, 1999 | (JP) | 11-243118 |

(51) Int. Cl.
*H01L 35/20* (2006.01)
*H01L 35/16* (2006.01)
*H01L 35/12* (2006.01)

(52) U.S. Cl. .................. 136/239; 136/236.1; 136/238; 136/240

(58) Field of Classification Search ............... 136/200, 136/236.1, 238, 239, 240
See application file for complete search history.

(56) References Cited

U.S. PATENT DOCUMENTS 3,898,080 A * 8/1975 Penn .................... 420/578
6,506,321 B1 * 1/2003 Yamashita et al. ....... 252/521.3

OTHER PUBLICATIONS

Arita, Y., Miyagawa, T., Matsui, T., "Thermoelectric properties of Ru2Si3 prepared by FZ and arc melting methods", 17$^{th}$ International Conference on Thermoelectric, May 1998, pp. 394–397.*

* cited by examiner

*Primary Examiner*—Patrick Ryan
*Assistant Examiner*—Thomas H. Parsons
(74) *Attorney, Agent, or Firm*—Dykema Gossett PLLC

(57) ABSTRACT

A thermoelectric conversion material is formed of a polycrystal structure of crystal grains composed of a silicon-rich phase, and an added element-rich phase in which at least one type of added element is deposited at the grain boundary thereof, the result of which is an extremely large Seebeck coefficient and low thermal conductivity, allowing the thermoelectric conversion rate to be raised dramatically, and affording a silicon-based thermoelectric conversion material composed chiefly of silicon, which is an abundant resource, and which causes extremely low environmental pollution.

22 Claims, 7 Drawing Sheets

THERMOELECTRIC CONVERSION MATERIAL AND METHOD OF PRODUCING THE SAME

TECHNICAL FIELD

This invention relates to a novel thermoelectric conversion material in which pure silicon is made to contain various types of added element, and more particularly relates to a silicon-based thermoelectric conversion material having a polycrystal structure, characterized in that the crystal structure comprises crystal grains composed of a silicon-rich phase, and a added element-rich phase in which at least one type of added element is deposited at the grain boundary thereof, the result of which is an extremely large Seebeck coefficient and low thermal conductivity of 50 W/m·K or less, allowing the thermoelectric conversion rate to be raised dramatically, and affording a silicon-based thermoelectric conversion material composed chiefly of silicon, which is an abundant resource, and which causes extremely little environmental pollution.

BACKGROUND ART

Thermoelectric conversion elements are devices that are expected to see practical use because of their efficient utilization of the high levels of thermal energy required in recent industrial fields. An extremely broad range of applications have been investigated, such as a system for converting waste heat into electrical energy, small, portable electric generators for easily obtaining electricity outdoors, flame sensors for gas equipment, and so forth.

This conversion efficiency from thermal energy to electrical energy is a function of the Figure of merit ZT, and rises in proportion to ZT. This Figure of merit ZT is expressed by Formula 1.

$$ZT = \alpha^2 \sigma T / \kappa \qquad \text{Formula 1}$$

Here, $\alpha$ is the Seebeck coefficient of the thermoelectric material, $\sigma$ is the electrical conductivity, $\kappa$ is the thermal conductivity, and T is the absolute temperature expressed as the average value for the thermoelectric element on the high temperature side ($T_H$) and the low temperature side ($T_L$).

Silicides such as $FeSi_2$ and SiGe, which are thermoelectric conversion materials that have been known up to now, are abundant natural resources, but the former has a Figure of merit ZT of 0.2 or less, its conversion efficiency is low, and its usable temperature range is extremely narrow, while no decrease in thermal conductivity is seen with the latter unless the germanium content is about 20 to 30 at %, and germanium is a scarce resource. Also, silicon and germanium have a state in which there is a broad liquidus and solidus for complete solid solution, and it is difficult to produce a uniform composition with melting or ZL (zone leveling), to name just two of the problems which have impeded industrial application. For these reasons, the above-mentioned materials have not found widespread use.

The thermoelectric materials with the highest Figure of merit at the present time are $IrSb_3$ having a skutterudite-type crystal structure, and BiTe, PbTe, and other such chalcogen compounds, which are known to provide highly efficient thermoelectric conversion capability, but from the standpoint of protecting the global environment, the use of these heavy metal elements is expected to be restricted in the future.

Silicon, meanwhile, has a high Seebeck coefficient, but has extremely high thermal conductivity, and is therefore not considered suitable as a high efficiency thermoelectric material, and research into the thermoelectric characteristics thereof has been limited to silicon with a carrier concentration of $10^{18}$ (M/m$^3$) or less.

DISCLOSURE OF THE INVENTION

The inventors discovered that doping pure silicon with various elements, such as doping silicon with both a trace amount of a Group III element or Group V element and a small amount of a Group IV element, makes it possible to lower thermal conductivity, and the Seebeck coefficient will be equivalent to or better than that of conventional Si—Ge and Fe—Si compounds, or will be extremely high at a given carrier concentration. They also discovered that this material exhibits a good Figure of merit as a thermoelectric conversion material, without losing the fundamental advantages afforded by silicon.

The inventors also produced p- and n-type semiconductors by doping pure silicon with various elements, and examined the relationship of the doping amount to the thermoelectric characteristics, and as a result found that up to a doping amount (that is, a carrier concentration) of $10^{18}$ (M/m$^3$), the Seebeck coefficient decreases in inverse proportion to the carrier concentration, but has a maximum value from $10^{18}$ to $10^{19}$ (M/m$^3$).

It is an object of the present invention to further lower thermal conductivity or further enhance the Seebeck coefficient and thereby improve performance, without sacrificing the high Seebeck coefficient and electrical conductivity had by this novel silicon-based thermoelectric conversion material discovered by the inventors.

The inventors diligently examined the mechanism by which a high Seebeck coefficient is obtained with a silicon-based thermoelectric conversion material doped with various added elements, whereupon they learned that this novel silicon-based material has a polycrystal structure having crystal grains composed of a silicon-rich phase, and a added element-rich phase in which at least one type of added element is deposited at the grain boundary thereof.

The term "added element" as used here includes elements with which silicon can be made into a p- or n-type semiconductor, or more specifically, elements that generate carriers and elements that do not generate carriers. Therefore, "added element" used by itself refers to both elements that generate carriers and elements that do not generate carriers, and when a distinction is to be made, we will refer to elements that generate carriers, or elements that do not generate carriers.

The "silicon-rich phase" is a crystal phase in which silicon accounts for at least 80 at % of the crystal grains. The "added element-rich phase" is a crystal phase in which an added element has been deposited at the grain boundary of crystal grain composed of a silicon-rich phase, encompassing everything from depositing just enough to adhere to the crystal grains to depositing enough to surface the crystal grains in a layer, depending on the doping amount, and this crystal phase has at least one type of added element deposited at the grain boundary of these crystal grains. A case in which a trace amount of silicon is deposited at the grain boundary is also included.

The inventors also investigated a crystal structure in which the inside of the crystal grains is a silicon-rich phase and the grain boundary is a added element-rich phase, whereupon they discovered that the conduction of carriers can be increased in a added element-rich phase in which the added element cohesion occurs at the grain boundary, and a high Seebeck coefficient is obtained in the silicon-rich phase (the main phase), which means that a material with a high Figure of merit is obtained.

In view of this, the inventors tried controlling the crystal structure aside from composition as a method for keeping the Seebeck coefficient high and lowering the thermal conductivity, whereupon they found that if the cooling rate is controlled during melting and solidification, the silicon-rich phase and added element-rich phase will be dispersed in the required arrangement within the material, and a material having a high Figure of merit will be obtained.

Specifically, the present invention is a thermoelectric conversion material in which the material itself is an ingot quenched from a melt, a sinter, a heat treated laminate, or a material having a porosity of 5 to 40%.

The present invention is also characterized in that the crystal grain size can be kept small (1 to 50 μm) and a thermoelectric conversion material having the above-mentioned special structure can be obtained by subjecting the above-mentioned melt to ordinary cooling or quenching, powderizing the resulting material, and molding and sintering this powder.

The inventors also discovered a method for obtaining a silicon-based powder for sintering, in which a silicon powder or a silicon-based powder containing a added element is coated with a added element by discharge plasma treatment or by a vapor phase growth method such as vapor deposition, sputtering, or CVD, or is coated with a added element by plasma treatment using a gas containing the added element, or a added element is embedded by mechanofusion.

The inventors diligently examined a structure and manufacturing method with which a silicon-based thermoelectric conversion material having the above structure could be obtained simply, and as a result learned that if a layer of silicon or including silicon and a layer including a added element are formed and laminated alternately, for instance, and then heat treated, the same structure as that shown in FIG. 5 will be obtained for every layer or in the lamination thickness direction.

The inventors also found that by alternately forming and laminating layers including silicon (silicon and a added element) with layers including a added element (in which the added element is the main component, but silicon is also included), the resulting structure will be two-dimensionally equivalent to a structure obtained by controlling the cooling rate during melting and solidification, and will be obtained with a simple method merely involving forming the above-mentioned material having a high Figure of merit on a substrate.

The inventors also diligently examined silicon-based thermoelectric conversion materials in which silicon is doped with a Group II, Group III, Group V, or Group VI element, a transition metal element, or a rare earth element. As a result, they noticed that the carrier concentration resulting from doping that is effective for a thermoelectric conversion material is $10^{17}$ to $10^{21}$ (M/m$^3$), and that there is a limit to the doping amount, whereas the thermal conductivity of the silicon-based material must be further decreased in order to raise the Figure of merit of the thermoelectric conversion material.

In view of this, they looked into compositions with which the thermal conductivity of the material could be greatly decreased and the Figure of merit markedly improved without lowering the Seebeck coefficient or electrical conductivity of the silicon-based thermoelectric conversion material. As a result, they learned that thermal conductivity can be greatly lowered without changing the carrier concentration in the silicon-based material by adding carbon, germanium, or tin (Group IV elements) as a added element that does not generate carriers.

They also learned that when the above-mentioned Group IV element is added, thermal conductivity decreases sharply up to a doping amount of 5 at %, and more or less reaches saturation at 10 at %, so a doping amount of 5 to 10 at % is ideal for lowering thermal conductivity, and furthermore, the structure must be such that the Group IV element is deposited at the grain boundary of the silicon-rich phase.

In particular, it was discovered that when germanium is used as the Group IV element, if the doping amount is small enough that there is no carrier generation, the germanium is replaced with silicon, resulting in a diamond-like crystal structure, and furthermore the phonon scattering is greater because the atomic weight of germanium is different from that of silicon, allowing the thermal conductivity to be greatly lowered.

The inventors produced ingots of p- and n-type semiconductors adjusted to a carrier concentration at which the Seebeck coefficient is higher ($10^{19}$ to $10^{21}$ M/m$^3$) by doping various elements in an amount of 0.05 to 20 at % into a silicon-based thermoelectric conversion material containing a dopant that generates carriers, after which they examined various methods for lowering the thermal conductivity of these ingots, and as a result they perfected the present invention upon discovering that thermal conductivity can be greatly decreased without sacrificing a high Seebeck coefficient and low electrical conductivity by making the bulk semiconductor porous.

In short, the silicon-based thermoelectric conversion material pertaining to the present invention is characterized by having a crystal structure that is polycrystalline and in which at least one type of added element is deposited on crystal grains in which silicon accounts for at least 80 at % of the structure, and at the grain boundary thereof. One of the following methods can be employed to obtain a polycrystal structure such as this.

1) Quenching the melt.
2) Powderizing the material and then sintering this powder.
3) Quenching the melt, and sintering the powder thus obtained.
4) Coating a silicon powder with the required added elements, etc., or causing these added elements to adhere to the powder, and sintering the resulting powder.
5) Alternately forming and laminating silicon layers or layers including silicon with layers including a added element, and then heat treating this product.

A compositional investigation was conducted into reducing the thermal conductivity of the silicon-based thermoelectric conversion material of the present invention, which revealed that a composition containing at least one of carbon, germanium, and tin as a added element that does not generate carriers, and particularly a composition containing germanium, is preferable, and that structurally, a lower thermal conductivity will be obtained by making the bulk semiconductor porous.

BEST MODE FOR CARRYING OUT THE INVENTION

The structure in which the above-mentioned added element-rich phase is formed at the boundary of the silicon-rich phase, which is a characteristic feature of the thermoelectric conversion material of the present invention, will now be described. First, $Si_{1-x}Ge_x$ melts (at %) were produced by arc melting, with various doping amounts of germanium (4N) into high purity silicon (10N). These ingots were quenched at a cooling rate of 50 to 200K/sec after melting to produce sample substrates. The crystal structure was observed by EPMA.

Figure 1A:
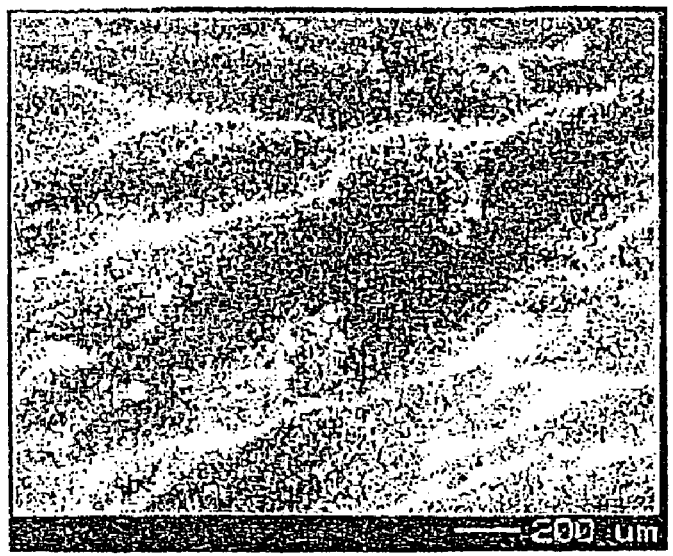
FIG. 1 is a photograph taken by EPMA of the crystal structure of the thermoelectric conversion material of the present invention (Si$_{0.97}$Ge$_{0.03}$), where A shows the segregation of a germanium added element, and B shows the segregation of a phosphorus dopant.
Figure 2A:
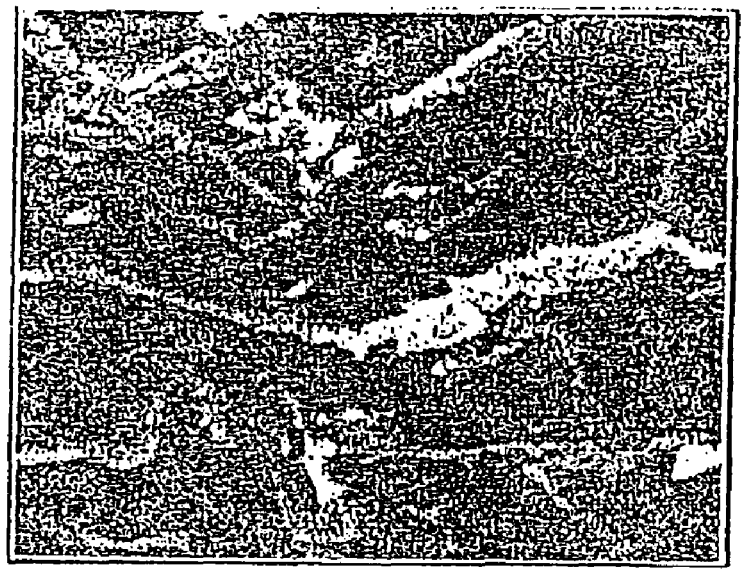
FIG. 2 is a photograph taken by EPMA of the crystal structure of the thermoelectric conversion material of the present invention ($Si_{0.95}Ge_{0.05}$), where A shows the segregation of a germanium added element, and B shows the segregation of a phosphorus dopant.
Figure 3A:
FIG. 3 is a photograph taken by EPMA of the crystal structure of the thermoelectric conversion material of the present invention ($Si_{0.9}Ge_{0.1}$), where A shows the segregation of a germanium added element, and B shows the segregation of a phosphorus dopant.

More specifically, FIG. 1A is when x=0.03, FIG. 2A when x=0.05, and FIG. 3A when x=0.1. The black parts in the photographs are the silicon-rich phase, which is virtually all silicon, although a trace amount of added element is included, and the white parts are the added element-rich (germanium) phase, and it can be seen that in this structure the germanium-rich phase is formed dispersed or clumped at the grain boundary of the silicon-rich phase.

Figure 1B:
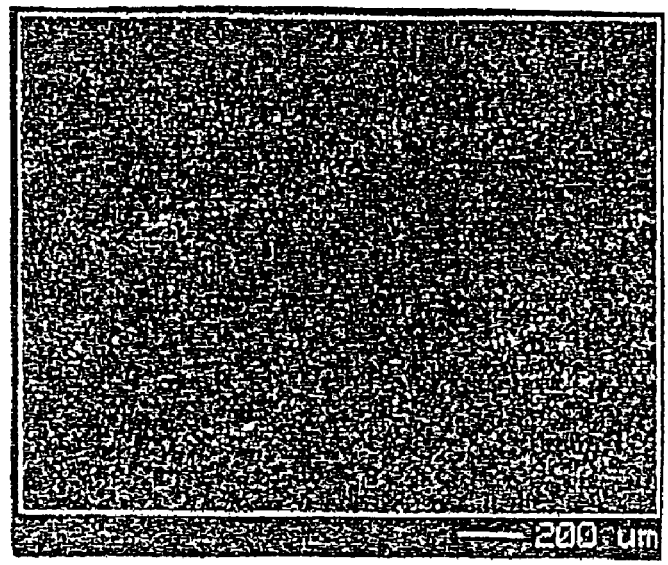
Figure 2B:
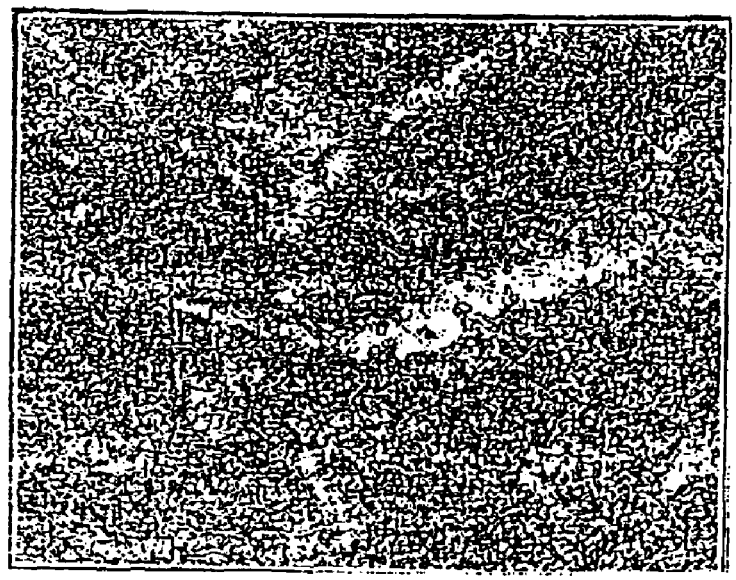
Figure 3B:

Also, a trace amount of phosphorus was added to the above-mentioned $Si_{1-x}Ge_x$ melts, but when just the phosphorus was observed, the EPMA photographs were as shown in FIGS. 1B, 2B, and 3B, with the white parts indicating places where the doped phosphorus is present, and it can be seen that in this structure the phosphorus is segregated in the same locations where the germanium-rich phase in FIGS. 1A to 3A was formed at the grain boundary of the silicon-rich phase.

Figure 4A:
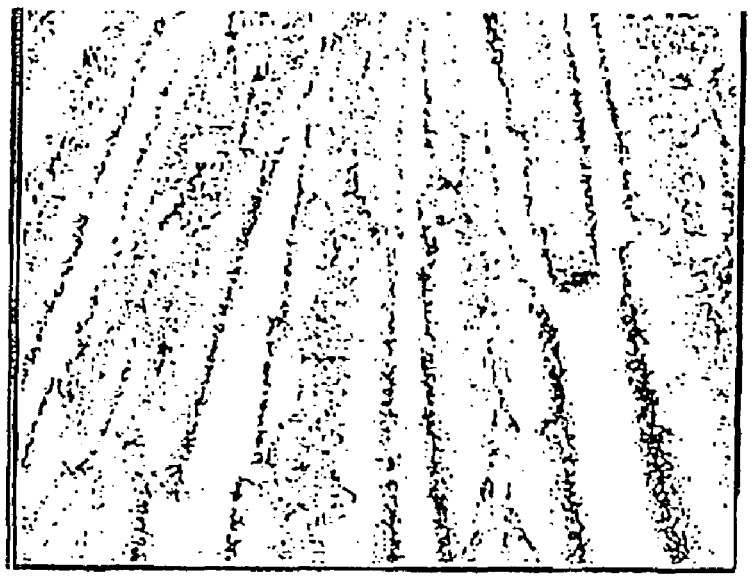
FIG. 4 is a photograph taken by EPMA of the crystal structure of a comparative material ($Si_{0.85}Ge_{0.15}$), where A shows the segregation of a germanium added element, and B shows the segregation of a phosphorus dopant.
Figure 4B:
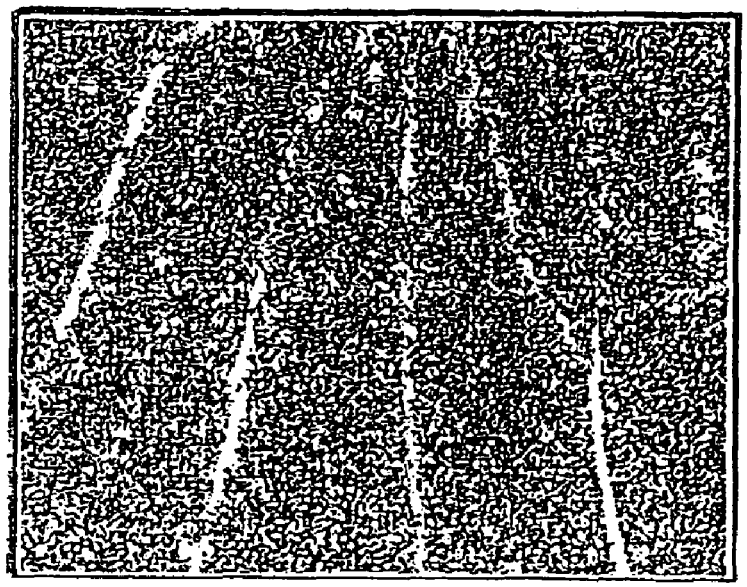

Meanwhile, as shown in FIGS. 4A and 4B, which are EPMA photographs of just germanium when x=0.15 with the above-mentioned $Si_{1-x}Ge_x$ melt and just phosphorus, respectively, the overall structure becomes an alloy phase in which the silicon and germanium are in solid solution, and it is clear that this is completely different from the structure of the thermoelectric conversion material pertaining to the present invention.

Figure 5:
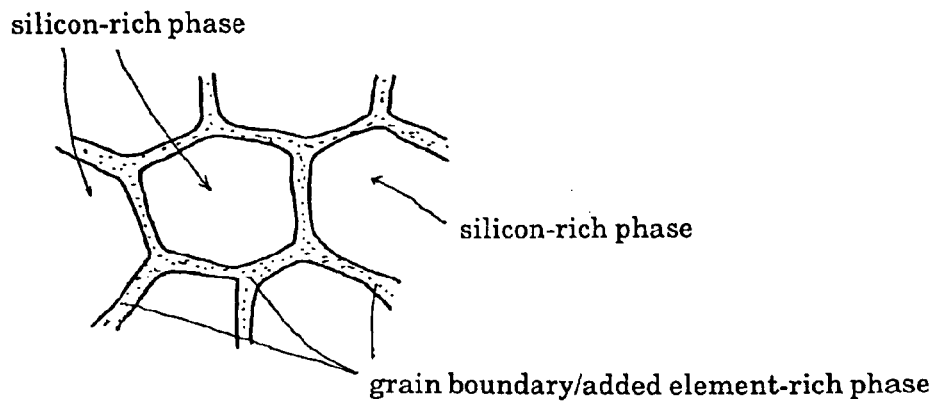
FIG. 5 is a schematic diagram illustrating the crystal structure of the thermoelectric conversion material of the present invention.

In other words, the structure of the silicon-based thermoelectric conversion material of the present invention, as shown by the schematic diagram in FIG. 5, is a structure in which are formed a silicon-rich phase consisting of silicon alone or almost entirely of silicon but including a trace amount of added element, and a added element-rich phase in which a added element such as germanium is segregated at the grain boundary of this silicon-rich phase. The size of the silicon-rich phase varies with the cooling rate, but is about 10 to 500 $\mu$m.

The relationship between carrier concentration and the state of crystal grain boundary deposition of a dopant of phosphorus or boron instead of germanium was examined, which confirmed that the carrier concentration obtained from the doping amount was in fairly good agreement with the measured carrier concentration. Because of the structure in which the added element-rich phase was formed at the grain boundary of the silicon-rich phase, the added element was clumped at the crystal grain boundary, the electrical conductivity resulting from carriers was high, a high Seebeck coefficient was obtained in the silicon-rich phase within the crystal grains, and most importantly, the thermal conductivity was reduced to less than 50 W/m·K.

Furthermore, it was confirmed that the thermal conductivity of this silicon-based thermoelectric conversion material decreases as the carrier concentration is increased. This is believed to be because lattice to thermal conduction was decreased by local phonon scattering of impurities resulting from the added element in the crystals.

Ingot Casting

It is believed that a structure in which a added element-rich phase of germanium or the like is dispersively formed at the grain boundary of a silicon-rich phase, which is a characteristic of a silicon-based thermoelectric conversion material, is obtained by controlling the cooling rate after casting, and that the crystal grain size is kept relatively small by quenching, segregation of a suitable added element other than silicon occurs at the crystal grain boundary, and this results in a high Seebeck coefficient despite the high electrical conductivity.

With the silicon-based thermoelectric conversion material of the present invention, the above-mentioned structure is obtained by cooling a silicon-based molten material, and arc melting and high-frequency melting are ideal melting methods for mass production. The cooling rate of the silicon-based molten material is suitably determined as dictated by the type and combination of added elements (discussed below), the doping amount, and so forth, as well as the cooling method employed, and the form in which the material is obtained, such as an ingot, a thin sheet, a substrate, or a ribbon.

Cooling methods that can be employed in the present invention include cooling the ingot just as it is, and cooling while pulling, such as a method in which a known CZ or FZ method for obtaining monocrystalline silicon is utilized and pulling and cooling are performed under conditions that allow polycrystalline silicon to be obtained. Because a CZ or FZ method allows numerous substrates of the required thickness to be manufactured from a pulled ingot rod, they are ideal methods for manufacturing a silicon-based substrate for use in thermoelectric conversion elements. Manufacture by ZL method is also possible.

Other methods may also be employed, such as a method in which a thin sheet is fabricated by casting and cooling a silicon-based molten material in a shallow plate, or utilizing a roll cooling method such as a known melt quenching method to control the cooling rate so that a thin sheet of the required thickness will be obtained.

For instance, when a silicon-based molten material is cast and cooled in a shallow plate, if the plate is water-cooled or brought into contact with a chiller, then cooling at a rate of at least 50 K/sec is appropriate, for example, which will keep the crystal grain size to just a few hundred microns or less and result in a high Seebeck coefficient. A preferable cooling rate is 50 K/sec to 500 Ksec, and it is possible to achieve an average crystal grain size of 10 to 200 μm.

Sintering

It is also possible to produce a silicon-based thermoelectric conversion material by sintering. A structure in which a added element-rich phase of germanium or the like is dispersively formed at the grain boundary of a silicon-rich phase is formed through the segregation of the added element in solid solution in the raw material powder particles during sintering. It is also effective for the sintering powder itself to have the same crystal structure.

To convert the crystal structure of the sintering powder itself into the polycrystal structure of the present invention, the cooling rate after ingot casting is controlled, the crystal grain size is kept relatively small by quenching, segregation of a suitable added element other than silicon occurs at the crystal grain boundary, and this results in a material powder exhibiting a high Seebeck coefficient despite the high electrical conductivity. Furthermore, sintering using this powder causes the segregation of the added element during sintering to occur more readily and effectively, and a sintered silicon-based thermoelectric conversion material that exhibits a high Seebeck coefficient is obtained.

In the present invention, even if the raw material has little of the above-mentioned segregation of a suitable added element other than silicon at the crystal grain boundary, if this raw material is pulverized and sintered, the required segregation will occur during sintering and the targeted structure can be obtained, so there are no particular restrictions on the cooling rate of the silicon-based molten material.

On the other hand, the cooling rate after ingot casting must be controlled in the present invention in order to use a powder that imparts a high Seebeck coefficient to the raw material powder and convert the crystal structure of the sintering powder itself into the structure in FIG. 5. Any method can be employed, but examples include a roll cooling method such as melt quenching, and a spraying method such as gas atomization. Cooling is particularly fast with roll cooling or spraying (about 500 to 1000 K/sec), allowing for a fine crystal grain size of 1 to 50 μm and making it possible to lower the thermal conductivity.

A powder can be produced by subjecting an ingot or thin sheet to a known mechanical pulverization process such as a stamp mill or ball mill, or a ribbon or other slender piece obtained by splat cooling can be pulverized, and the average particle size of the powder should be adjusted to 10 to 100 μm. With a spray method, a small crystal grain size of 1 to 10 μm can be obtained, a fine powder with a particle diameter of 3 to 50 μm can also be obtained, and there is little particle growth after sintering, making this an ideal raw material powder for sintering.

Any sintering method can be used in the present invention as long as it allows for firing at about 1470 to 1630K, which is close to the melting point of silicon. An ordinary firing method in which sintering is performed after compression molding, or a known sintering means such as hot pressing or discharge plasma sintering in which sintering is performed during compression molding, can be selected as deemed appropriate. The preferred conditions should be appropriately selected according to the selected sintering means such that the sintering time is maintained at 0.5 hour or longer, the temperature is 1470 to 1630K, and the sintering is performed in a vacuum or an inert gas.

Coating

A sample substrate was produced by cooling at a rate of 50 K/sec after melting, the substrate was then pulverized into a powder with an average particle size of 30 μm, a $Si_{1-x}Ge_x$ powder coated with a added element was produced by discharge plasma treatment, and this powder was sintered at 1520 to 1630K. The crystal structure of the obtained sample was observed by EPMA, which revealed that melting and solidification produced the same structure as in FIGS. 1 to 3, and that the size of the silicon-rich phase was a relatively small 10 to 100 μm.

It was also confirmed that the structure in which a added element-rich phase is dispersively formed at the grain boundary of a silicon-rich phase shown in FIG. 5 can be obtained by causing added element to adhere only partially to the surface of silicon or silicon-based powder particles and then sintering this product.

The coating or adhesion of the added element onto the surface of a silicon powder or a silicon-based powder containing a added element can be accomplished by any known growth, film formation, binding, or adhesive means, such as vapor deposition, sputtering, CVD, or another such vapor phase growth method, discharge plasma treatment, or plasma treatment using a gas containing a added element.

The phrase "coating with a added element" as used in the present invention encompasses everything from forming a complete film on the silicon particle surface to merely causing added element particles to adhere to the silicon particle surface. In other words, the added element particles need not completely cover the silicon particle surface, and may instead just adhere up to the time of the sintering treatment. Also, as will be discussed below, any element can be added as the added element, so a variety of cases are conceivable, including those in which any means can be selected and those in which the means is limited by the type of element in question. In addition, the treatment conditions for the selected means will vary considerably with the combination of elements when two or more are used, so the above-mentioned means and conditions must be appropriately selected according to the targeted composition.

Figure 6A:
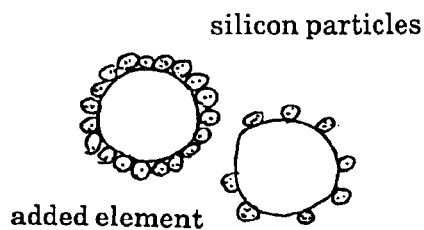
FIG. 6 is a schematic diagram illustrating the state of silicon particles of the thermoelectric conversion material powder of the present invention, where A shows the added element on the surface, and B shows the added element embedded.

For instance, the example shown in FIG. 6A is one in which a added element has been bound to the particle surface of a silicon powder adjusted to a specific particle size by pulverizing an ingot or thin sheet, or a silicon powder obtained directly by spray method. The binding may be accomplished by any means, such as growth or film formation as discussed below, and the binding amount is suitably selected so as to achieve the targeted composition after sintering. The same treatment can be performed on silicon-based particles in which the silicon powder itself contains the required added element. The structure in which a added element-rich phase is dispersively formed at the grain boundary of a silicon-rich phase shown in FIG. 5 can be obtained by sintering a silicon powder composed of silicon particles in which the required added element is bound to the surface.

Figure 6B:
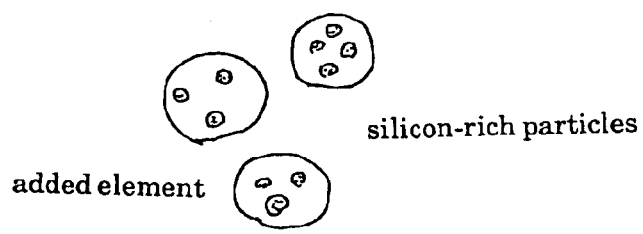

The example shown in FIG. 6B is one in which the added element is imbedded in the silicon particle surface by mechanofusion treatment so that the silicon particles are silicon-rich particles, and the structure in which a added element-rich phase is dispersively formed at the grain boundary of a silicon-rich phase shown in FIG. 5 can be obtained by sintering a silicon-rich powder composed of silicon-rich particles in which the required added element is imbedded in the surface.

Lamination

The thermoelectric conversion material of the present invention can make use of a monocrystalline or polycrystalline silicon substrate, a glass or ceramic substrate, a resin substrate, or the like, or a resin film, or any known substrate or film that can be utilized in the formation of a thermoelectric conversion element, for instance, over another film. The structure is characterized in that a silicon layer or a layer containing silicon as its main component and a layer having as its main component one or more added elements are laminated over one of these substrates or films. In other words, a laminate of a silicon layer or a layer containing silicon and a layer containing a added element is formed on a substrate.

For instance, the structural example shown in FIG. 7 is such that first a thin film layer of germanium and phosphorus is formed in the required thickness as the layer containing added elements over a monocrystalline silicon substrate with a crystal plane of (111) or (100), then a thin film layer of just silicon is formed in the required thickness as the layer containing silicon, and the above-mentioned thin film layers of germanium and phosphorus and thin film layers of silicon are alternately laminated.

Figure 7A:
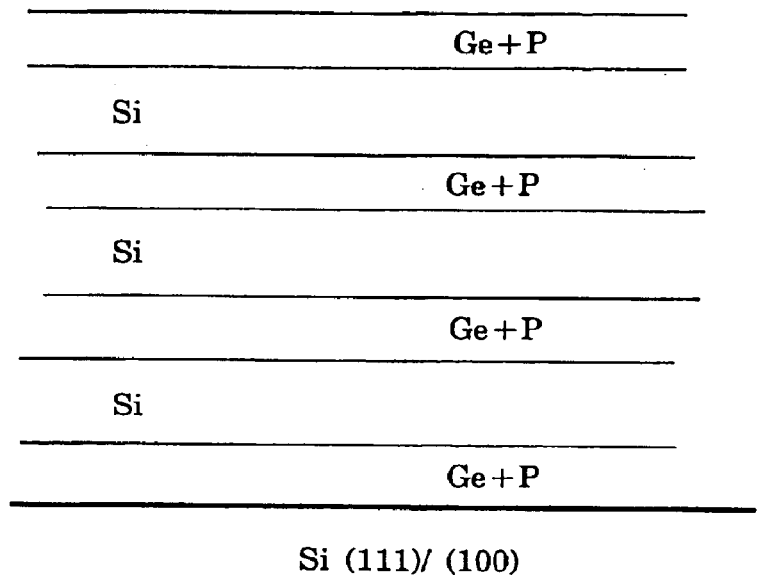
FIG. 7 is a diagram illustrating a lamination pattern in the thermoelectric conversion material of the present invention.
Figure 7B:
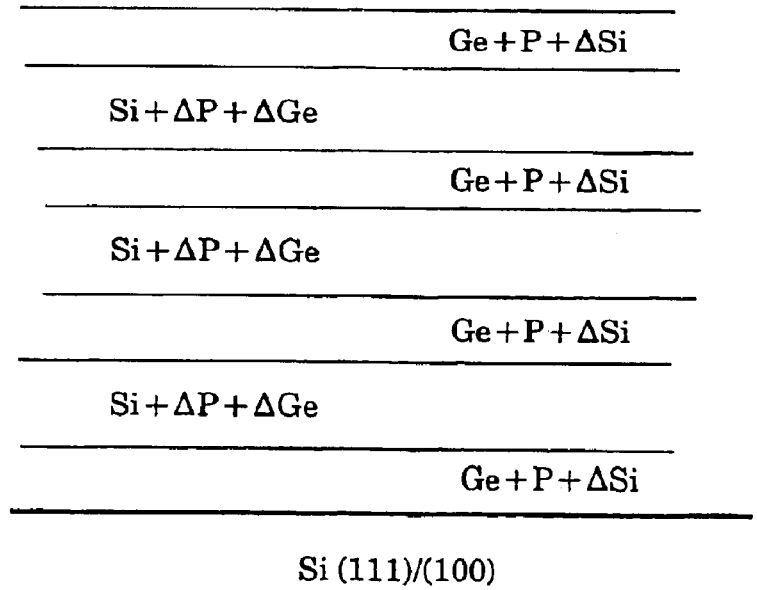

If a heat treatment (1 hour at 873K in a vacuum, for example) is conducted after lamination, then as shown in FIG. 7B, there will be diffusion between the thin film layers, resulting in a laminate in which thin film layers of Ge+P+ΔSi into which silicon has diffused are alternately laminated with thin film layers of Si+ΔP+ΔGe into which germanium and phosphorus have diffused. When the layer containing silicon in FIG. 7A is an Si+P thin film layer, the Si+P layer will become an Si+ΔGe+player after heat treatment.

Figure 8:
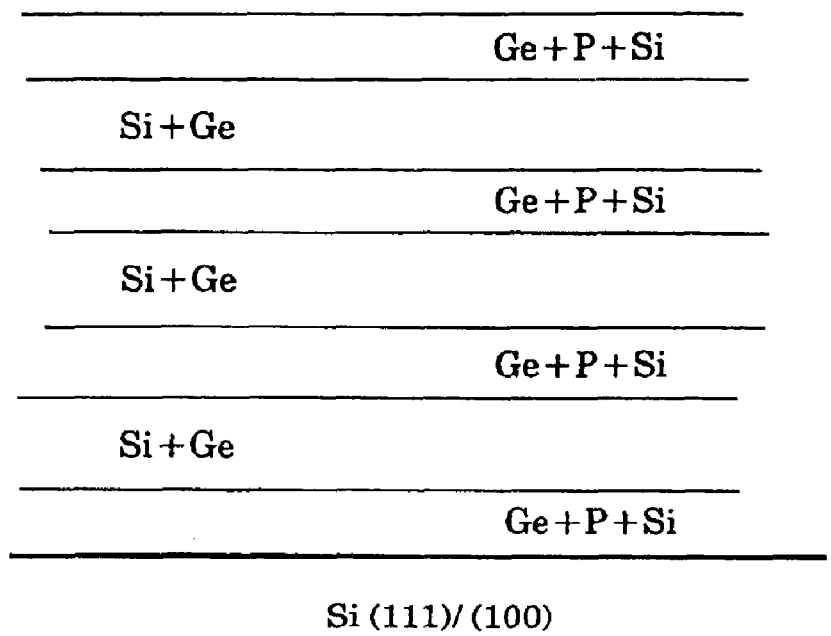
FIG. 8 is a diagram illustrating another lamination pattern in the thermoelectric conversion material of the present invention.

Also, as shown in FIG. 8, the heat treated lamination state of FIG. 7B can be achieved by forming a thin film layer of Ge+P+Si (made up primarily of germanium and phosphorus, but including silicon as well; used as the layer containing a added element) in the required thickness, then forming a thin film layer of Si+Ge (used as the layer containing silicon) in the required thickness, and then alternately laminating these Ge+P+Si thin film layers and Si+Ge thin film layers.

The laminate shown in FIG. 7B or FIG. 8, formed by lamination over a monocrystalline silicon substrate, is equivalent to the structure shown in FIG. 5, in which a silicon-rich phase consisting primarily of silicon and a added element-rich phase in which a added element has become segregated at the grain boundary of this silicon-rich phase are formed in the thickness direction (that is, the lamination direction), and when a diffusion heat treatment is performed, the resulting structure is similar in the plan view of the various thin film layers. This laminate is a thermoelectric conversion material having a structure equivalent to that in FIG. 5, which was obtained by quenching a silicon-based melt containing the required amounts of germanium and phosphorus.

Therefore, as to the thickness of the above-mentioned silicon layers (or layers containing silicon) and layers containing a added element, and the lamination thickness ratio thereof, the composition and thickness of the layers containing silicon and the layers containing a added element must be selected according to the composition of the targeted silicon-based thermoelectric conversion material so that these are suitably dispersed, and any lamination means can be employed as long as the structure shown in FIG. 5 can at least be achieved in the lamination direction. Examples include varying the composition of the layers containing silicon and the layers containing a added element for each lamination, and combining a variety of compositions or using various patterns in which the lamination pattern is not merely alternating as above.

A thermoelectric conversion material in which films are formed and laminated over a substrate as above is suitably designed so the composition discussed below will be achieved for the laminate as a whole, and the structure shown in FIG. 5 is formed in the lamination direction, so a thermoelectric conversion element can be easily obtained by forming and laminating p- and n-type semiconductors, electrode films, and the like from this silicon-based thermoelectric conversion material in a suitable pattern so that the temperature gradient direction of the targeted thermoelectric conversion element will be the above-mentioned lamination direction.

The film formation and lamination can be accomplished by any known growth or film formation means, such as vapor deposition, sputtering, CVD, or another such vapor phase growth method, discharge plasma treatment, or plasma treatment using a gas containing a added element. Also, as will be discussed below, any element can be added as the added element, so a variety of cases are conceivable, including those in which any means can be selected and those in which the means is limited by the type of element in question. In addition, the treatment conditions for the selected means will vary considerably with the combination of elements when two or more are used, so the above-mentioned means and conditions must be appropriately selected according to the targeted composition. As for the heat treatment, any temperature conditions, atmosphere, and heating method can be employed as long as the conditions result in the desired diffusion between the layers.

Composition

The added element that is contained in silicon in the present invention may be any element that is added in order to obtain a higher Seebeck coefficient and at the same time lower the thermal conductivity at a carrier concentration within the required range, and one or more types of added element are contained in an amount of 0.001 to 30 at %.

It is particularly favorable to select as the dopant an element that generates carriers (discussed below) for making silicon into a p- or n-type semiconductor. A dopant for generating carriers and making a p-type semiconductor (called dopant Ap) and a dopant for making an n-type semiconductor (called dopant An) are each contained in an amount of 0.001 to 10 at %.

Dopant Ap and dopant An can be selected in any combination of each group, as long as at least one type from each group is contained in a total amount of 0.002 to 20 at %, dopant Ap or An is combined in a total amount that is over that of the corresponding dopant An or Ap and is large enough to create a p-type semiconductor or n-type semiconductor. To obtain a p-type semiconductor, for example, the total amount of dopant An should be over that of dopant Ap and be large enough to create a p-type semiconductor.

Not only when the added element is one that does not generate carriers, but even with an element that does generate carriers, if a dopant is required which generates separate carriers due to the doping amount or the combination (when two or more are used), one or more types of dopant that generates carriers may be contained in addition to the first added element in an amount of 0.001 to 10 at %, and preferably 0.001 to 5 at %.

When the applications of a thermoelectric conversion material are considered, emphasis must be placed on one of the characteristics, such as the Seebeck coefficient, electrical conductivity, or thermal conductivity depending on the conditions which vary with the application, such as the heat source, where and how the material is used, and the size of the current and voltage to be handled, but the thermoelectric conversion material of the present invention allows the carrier concentration to be determined by means of the added amount of the selected added element.

It is preferable for the added element Ap for generating carriers and creating a p-type semiconductor to be one or more types selected from the group consisting of an Ap1 group (Be, Mg, Ca, Sr, Ba, Zn, Cd, Hg, B, Al, Ga, In, Tl) and transition metal elements $M_1$ (Y, Mo, Zr). Of these, boron, gallium, and aluminum are particularly favorable dopants.

It is preferable for the dopant An for generating carriers and creating an n-type semiconductor to be one or more types selected from the group consisting of an An1 group (N, P, As, Sb, Bi, O, S, Se, Te), transition metal elements $M_2$ (Ti, V, Cr, Mn, Fe, Co, Ni, Cu, Nb, Ru, Rh, Pd, Ag, Hf, Ta, W, Re, Os, Ir, Pt, Au; where Fe accounts for 10 at % or less), and rare earth elements RE (La, Ce, Pr, Nd, Pm, Sm, Eu, Gd, Tb, Dy, Ho, Er, Yb, Lu). Of these, phosphorus, arsenic, antimony, and Bi are particularly favorable dopants.

Examples of determining the carrier concentration will now be given. When one or more elements from the above-mentioned Ap1 group of dopants are contained in an amount of 0.001 to 0.5 at %, a p-type semiconductor with a carrier concentration of $10^{17}$ to $10^{20}$ (M/m$^3$) will be obtained, and when elements from the Ap1 group are contained in an amount of 0.5 to 5.0 at %, a p-type semiconductor with a carrier concentration of $10^{19}$ to $10^{21}$ (M/m$^3$) will be obtained.

Similarly, when one or more elements from the above-mentioned An1 group of dopants are contained in an amount of 0.001 to 0.5 at %, an n-type semiconductor with a carrier concentration of $10^{17}$ to $10^{20}$ (M/m$^3$) will be obtained, and when elements from the An1 group are contained in an amount of 0.5 to 10 at %, an n-type semiconductor with a carrier concentration of $10^{19}$ to $10^{21}$ (M/m$^3$) will be obtained.

When elements from the above-mentioned dopant groups Ap1 or An1 are contained in an amount of 0.5 to 5.0 at % so that the carrier concentration is $10^{19}$ to $10^{21}$ (M/m$^3$), a highly efficient thermoelectric conversion element is obtained, and the thermoelectric conversion efficiency is excellent, but the thermal conductivity thereof is about 50 to 150 W/m·K at room temperature, and if the thermal conductivity could be decreased, there would be a further improvement in the Figure of merit ZT.

It is possible in the present invention to decrease thermal conductivity and to increase phonon scattering without changing the carrier concentration by adding at least one Group III element and at least one Group V element and controlling the carrier concentration to a range of $10^{19}$ to $10^{21}$ (M/m$^3$). A p-type semiconductor will be obtained if the Group III element is contained in an amount 0.3 to 5 at % larger than the Group V element, and an n-type semiconductor will be obtained if the Group V element is contained in an amount 0.3 to 5 at % larger than the Group III element.

The inventors also investigated whether a decrease in thermal conductivity could be achieved with something other than Group III elements Group V elements, and found that the crystal structure can be disturbed without changing the carrier concentration in the silicon, the thermal conductivity can be brought below 50 W/m·K at room temperature, and a highly efficient thermoelectric conversion material can be obtained by adding a Group III–V compound semiconductor or a Group II–VI compound semiconductor to silicon, further adding at least one type of Group III element or Group V element and controlling the carrier concentration to a range of $10^{19}$ to $10^{21}$ (M/m$^3$).

Furthermore, as a result of variously investigating other added elements to silicon, the inventors found that if the silicon contains the Group IV elements germanium, carbon, and tin in an amount of 0.1 to 5 at %, and some of the silicon atoms are replaced with a Group IV element with a different atomic weight, there will be greater phonon scattering in the crystals and the thermal conductivity of the semiconductor can be reduced to no more than 50 W/m·K at room temperature.

Other elements besides the above-mentioned Group III and V elements were examined to see if they could similarly be added to silicon in the thermoelectric conversion material of the present invention, whereupon it was confirmed that while there are no particular restrictions as long as a p- or n-type semiconductor will result, if elements whose ion radii are too different are used, almost all will precipitate in the grain boundary phase, so it is preferable to use an element whose ion radius is relatively close to that of silicon.

When one or more of germanium, carbon, and tin are selected as added elements in the thermoelectric conversion material of the present invention, it is preferable for the composition to be such that these added elements that do not generate carriers are contained in an amount of 0.1 to 10 at %, and one or more dopants that do generate carriers are contained in an amount of 0.001 to 20 at %.

Specifically, with a thermoelectric conversion material, thermal conductivity will be high if one or more of germanium, carbon, and tin are contained in an amount less than 0.1 at %, so a high Figure of merit will not be obtained, but while thermal conductivity will decrease somewhat if 10 at % is exceeded, the Group IV element will at the same time also diffuse into the silicon-rich phase in the particles, producing a solid solution, so there will be a drop in the high Seebeck coefficient of the silicon, and the Figure of merit will be lower. Thus, the Group IV elements other than silicon should be contained in an amount of 0.1 to 10 at %, and preferably 5 to 10 at %.

The purpose of adding a Group III–V compound semiconductor or a Group II–VI compound semiconductor is to reduce thermal conductivity without changing the carrier concentration of the material, and the desired effect will not be obtained below 1 at %, but adding in an amount over 10 at % will result in almost no decrease in thermal conductivity, so an amount of 1 to 10 at % is preferable.

Porosity

The inventors employed the following process to produce a p-type Si—Ge semiconductor with controlled porosity. First, one or more transition metal elements, Group II elements, and Group III elements were added and melted so that the carrier concentration was $10^{19}$ to $10^{21}$ (M/m$^3$), and the resulting ingot was coarsely ground, ground in a disk mill, and ground in a jet mill. After this, the powder was subjected to hot pressing or discharge plasma sintering under various molding temperature and pressure conditions. The thermoelectric conversion characteristics of the thermoelectric conversion material of a p-type semiconductor with controlled porosity were measured.

With an Si0.95Ge0.05 p-type semiconductor doped with 0.3 at % boron, porosity caused no major change in the Seebeck coefficient or electrical resistance up to a porosity of 40%, but from a porosity of 5%, the thermal conductivity decreased greatly as porosity increased, and was found to have dropped to about 30% of that of an arc-melted ingot at a porosity of 40%.

With a p-type semiconductor, at a porosity of less than 5% the thermal conductivity is virtually the same as that of an ingot, and when the porosity is over 40%, the Seebeck coefficient decreases and electrical resistivity increases, the result of which was found to be a decrease in the Figure of merit. The porosity (X%) here was determined using the formula (100−Y) (%) from the relative density (Y%) of a hot pressed article, where the density of the ingot is 100%.

Meanwhile, the following process was employed to produce an n-type silicon-based material with controlled porosity. First, one or more rare earth elements, Group V elements, and Group VI elements were added and melted so that the carrier concentration was $10^{19}$ to $10^{21}$ (M/m$^3$), and the resulting ingot was coarsely ground, ground in a disk mill, and ground in a jet mill. After this, the powder was subjected to hot pressing or discharge plasma sintering under various molding temperature and pressure conditions. The thermoelectric conversion characteristics of the thermoelectric conversion material of an n-type semiconductor with controlled porosity were measured.

With an $Si_{0.95}Ge_{0.05}$ n-type semiconductor doped with 0.4 at % phosphorus, just as with the p-type semiconductor, porosity caused no major change in the Seebeck coefficient or electrical resistance up to a porosity of 40%, but from a porosity of 5%, the thermal conductivity decreased greatly as porosity increased, and was found to have dropped to about 30% of that of an arc-melted ingot at a porosity of 40%.

With an n-type semiconductor, at a porosity of less than 5% the thermal conductivity is virtually the same as that of an ingot, and when the porosity is over 40%, the Seebeck coefficient decreases and electrical resistivity increases, the result of which was found to be a decrease in the Figure of merit.

It is preferable for the hot pressing treatment conditions in the present invention to comprise a temperature of 1423 to 1573K and a pressure of 25 to 150 MPa. If the temperature is below 1423K, the porosity of the sinter will exceed 40%, but partial melting will occur if the temperature is over 1573K. The pressure should be appropriately selected so as to achieve the specified porosity.

It is preferable for the discharge plasma sintering conditions in the present invention to comprise a temperature of 1503 to 1573K and a pressure of 25 to 150 MPa. If the temperature is below 1503K, the porosity of the sinter will exceed 40%, but partial melting will occur if the temperature is over 1573K.

EXAMPLES

Example 1

High-purity silicon (10N) and a added element (dopants that generate carriers are labeled Ap and An, while added elements that do not generate carriers are labeled Bnc; the same applies to all the added elements in the following examples) were compounded as shown in Table 1 and then arc-melted in an argon gas atmosphere to produce p- and n-type silicon thermoelectric conversion semiconductors. The temperature in the arc melting was approximately 1900K, and the molten material was cooled at a rate of 50 to 100 K/sec by a water-cooled copper base. The average crystal grain size of the obtained material was approximately 50 to 100 $\mu$m.

The button-shaped ingots thus obtained were cut to sizes of 5×5×15 mm, 10×10×2 mm, and 10 (outside diameter)×2 mm, and the Seebeck coefficient, Hall coefficient (including carrier concentration and electrical conductivity), and thermal conductivity were measured for each. The measurement values at 1100K and the Figure of merit (ZT=$S^2T/\rho\kappa$) are shown in Table 2.

The temperature differential between the high and low temperature portions during temperature elevation was set to be about 6K, the thermoelectromotive force of the samples was measured with a digital multimeter, and this value was divided by the temperature differential to find the Seebeck coefficient. The Hall coefficient was measured by AC method, and the electrical resistance was measured by four-probe method simultaneously with the carrier concentration. The thermal conductivity was measured by laser flash method.

Example 2

In order to produce p- and n-type silicon thermoelectric semiconductors, high-purity silicon (10N) and added elements were compounded as shown in Table 3, after which this product was put in a graphite crucible and melted in a high-frequency melting furnace in a vacuum ($10^{-4}$ Torr). The melting temperature was approximately 1900K, the casting temperature was approximately 1800K, and the melt was cast into a mold with a thickness of 10 mm. The cooling rate of the molten material was 10 to 50 K/sec, and the average crystal grain size of the material was approximately 100 to 500 $\mu$m.

The ingots thus obtained were cut to sizes of 5×5×15 mm, 10×10×2 mm, and 10 (outside diameter)×2 mm, and the Seebeck coefficient, Hall coefficient (including carrier concentration and electrical conductivity), and thermal conductivity of each were measured by the same methods as in Example 1. Table 4 shows the measured values at 1100K and the Figure of merit (ZT=$S^2T/\rho\kappa$).

Example 3

In order to produce p- and n-type silicon thermoelectric semiconductors, high-purity silicon (10N) and added elements were compounded as shown in Table 5, after which this product was put in a graphite crucible and melted in a high-frequency melting furnace in a vacuum ($10^{-4}$ Torr), and it was confirmed that the components melted uniformly at approximately 1800K.

After this, the upper part of the above-mentioned graphite crucible was lowered to 1700K, silicon seed crystals were brought into contact with the top of the melt, and the melt was slowly pulled up. The inside diameter of the crucible was 100 mm, the pulling rate was 0.3 to 1 mm/sec, and the pulled crystals were vibrated once every five seconds in order to render them polycrystalline. The average crystal grain size of the obtained material was approximately 1 to 10 μm.

The ingots thus obtained were cut to sizes of 5×5×15 mm, 10×10×2 mm, and 10 (outside diameter)×2 mm, and the Seebeck coefficient, Hall coefficient (including carrier concentration and electrical conductivity), and thermal conductivity of each were measured by the same methods as in Example 1. Table 6 shows the measured values at 1100K and the Figure of merit ($ZT = S^2 T/\rho\kappa$).

TABLE 1

| No. | Added element Bnc | Doping amount (at %) | Dopant Ap, An | Doping amount (at %) | Melting temp. (K) | Cooling rate (K/sec) | Crystal grain size (μm) |
|---|---|---|---|---|---|---|---|
| 1 |    |   | B  | 0.3 | 1900 | 50  | 100 |
| 2 |    |   | Al | 1   | 1900 | 50  | 100 |
| 3 | Ge | 3 | B  | 0.3 | 1900 | 50  | 100 |
| 4 | Ge | 3 | B  | 0.3 | 1900 | 100 | 50  |
| 5 | Ge | 3 | Ga | 1   | 1900 | 50  | 100 |
| 6 |    |   | P  | 1   | 1900 | 50  | 100 |
| 7 |    |   | As | 1   | 1900 | 50  | 100 |
| 8 | Ge | 3 | P  | 1   | 1900 | 50  | 100 |
| 9 | Ge | 3 | P  | 1   | 1900 | 100 | 50  |
| 10 | Ge | 3 | Sb | 3  | 1900 | 50  | 100 |

TABLE 2

| No. | Seebeck coefficient (mV/K) | Electrical resistivity ×10⁻⁵ (Ω·m) | Thermal conductivity (W/m·K) | Figure of merit (ZT) |
|---|---|---|---|---|
| 1  |  0.267 | 1.15 | 37 | 0.18 |
| 2  |  0.231 | 1.24 | 45 | 0.11 |
| 3  |  0.272 | 1.18 | 12 | 0.57 |
| 4  |  0.286 | 1.25 |  9 | 0.80 |
| 5  |  0.291 | 1.37 | 10 | 0.68 |
| 6  | -0.301 | 1.24 | 42 | 0.19 |
| 7  | -0.318 | 1.31 | 48 | 0.18 |
| 8  | -0.305 | 1.28 | 12 | 0.67 |
| 9  | -0.314 | 1.33 |  9 | 0.91 |
| 10 | -0.332 | 1.42 | 10 | 0.85 |

TABLE 3

| No. | Added element Bnc | Doping amount (at %) | Dopant Ap, An | Doping amount (at %) | Melting temp. (K) | Cooling rate (K/sec) | Crystal grain size (μm) |
|---|---|---|---|---|---|---|---|
| 11 |    |   | B  | 0.3 | 1900 | 30 | 250 |
| 12 |    |   | Al | 1   | 1900 | 30 | 250 |
| 13 | Ge | 3 | B  | 0.3 | 1900 | 50 | 100 |
| 14 | Ge | 3 | B  | 0.3 | 1900 | 30 | 250 |
| 15 | Ge | 3 | B  | 0.3 | 1900 | 10 | 500 |
| 16 | Ge | 3 | Ga | 1   | 1900 | 30 | 250 |
| 17 |    |   | P  | 1   | 1900 | 30 | 250 |
| 18 |    |   | As | 1   | 1900 | 30 | 250 |
| 19 | Ge | 3 | P  | 1   | 1900 | 50 | 100 |
| 20 | Ge | 3 | P  | 1   | 1900 | 30 | 250 |
| 21 | Ge | 3 | P  | 1   | 1900 | 10 | 500 |
| 22 | Ge | 3 | Sb | 3   | 1900 | 30 | 250 |

TABLE 4

| No. | Seebeck coefficient (mV/K) | Electrical resistivity ×10⁻⁵ (Ω·m) | Thermal conductivity (W/m·K) | Figure of merit (ZT) |
|---|---|---|---|---|
| 11 |  0.272 | 1.08 | 42 | 0.18 |
| 12 |  0.234 | 1.18 | 48 | 0.11 |
| 13 |  0.278 | 1.16 | 14 | 0.52 |
| 14 |  0.280 | 1.12 | 13 | 0.59 |
| 15 |  0.282 | 1.09 | 12 | 0.67 |
| 16 |  0.294 | 1.33 | 12 | 0.60 |
| 17 | -0.309 | 1.20 | 48 | 0.18 |
| 18 | -0.321 | 1.29 | 52 | 0.17 |
| 19 | -0.306 | 1.25 | 14 | 0.59 |
| 20 | -0.309 | 1.21 | 13 | 0.67 |
| 21 | -0.312 | 1.19 | 12 | 0.75 |
| 22 | -0.337 | 1.40 | 12 | 0.74 |

TABLE 5

| No. | Added element Bnc | Doping amount (at %) | Dopant Ap, An | Doping amount (at %) | Pulling temp. (K) | Pulling rate (mm/sec) | Crystal grain size (mm) |
|---|---|---|---|---|---|---|---|
| 31 |    |   | B  | 0.3 | 1900 | 0.3 | 3 |
| 32 |    |   | Al | 1   | 1900 | 0.3 | 3 |
| 33 | Ge | 3 | B  | 0.3 | 1900 | 1   | 1 |
| 34 | Ge | 3 | B  | 0.3 | 1900 | 0.3 | 3 |
| 35 | Ge | 3 | B  | 0.3 | 1900 | 0.1 | 9 |
| 36 | Ge | 3 | Ga | 1   | 1900 | 0.3 | 3 |
| 37 |    |   | P  | 1   | 1900 | 0.3 | 3 |
| 38 |    |   | As | 1   | 1900 | 0.3 | 3 |
| 39 | Ge | 3 | P  | 1   | 1900 | 1   | 1 |
| 40 | Ge | 3 | P  | 1   | 1900 | 0.3 | 3 |
| 41 | Ge | 3 | P  | 1   | 1900 | 0.1 | 9 |
| 42 | Ge | 3 | Sb | 3   | 1900 | 0.3 | 3 |

TABLE 6

| No. | Seebeck coefficient (mV/K) | Electrical resistivity ×10⁻⁵ (Ω·m) | Thermal conductivity (W/m·K) | Figure of merit (ZT) |
|---|---|---|---|---|
| 31 |  0.275 | 1.05 | 45 | 0.18 |
| 32 |  0.237 | 1.14 | 51 | 0.11 |
| 33 |  0.280 | 1.19 | 17 | 0.43 |
| 34 |  0.283 | 1.13 | 15 | 0.52 |
| 35 |  0.285 | 1.10 | 14 | 0.58 |
| 36 |  0.298 | 1.30 | 14 | 0.54 |
| 37 | -0.311 | 1.17 | 51 | 0.18 |
| 38 | -0.324 | 1.26 | 54 | 0.17 |
| 39 | -0.309 | 1.22 | 16 | 0.54 |
| 40 | -0.311 | 1.20 | 14 | 0.63 |

TABLE 6-continued

| No. | Seebeck coefficient (mV/K) | Electrical resistivity ×10⁻⁵ (Ω · m) | Thermal conductivity (W/m · K) | Figure of merit (ZT) |
|---|---|---|---|---|
| 41 | −0.315 | 1.18 | 13 | 0.71 |
| 42 | −0.339 | 1.38 | 13 | 0.70 |

Example 4

In order to produce p- and n-type silicon thermoelectric semiconductors, high-purity silicon (10N) and added elements were compounded as shown in Table 7, after which this product was put in a graphite crucible and vacuum melted in a high-frequency melting furnace. After melting, the material was cast into a mold with a thickness of 10 mm, and the ingots were ground and then pulverized to an average crystal grain size of 1 to 50 μm in a stamp mill and a ball mill. The ball mill was a wet type and made use of a xylene solvent.

The pulverized raw material powder was subjected to hot pressing in argon for 1 hour at 1325K and 100 MPa to obtain sinters. The sinter samples thus obtained were cut to sizes of 5×5×15 mm, 10×10×2 mm, and 10 (outside diameter)×2 mm, and the Seebeck coefficient, Hall coefficient (including carrier concentration and electrical conductivity), and thermal conductivity of each were measured. Table 8 shows the measured values at 1100K and the Figure of merit (ZT=S2T/ρκ).

Example 5

In order to produce p- and n-type silicon thermoelectric semiconductors, high-purity silicon (10N) and added elements were compounded as shown in Table 9, after which this product was put in a graphite crucible and vacuum melted in a high-frequency melting furnace. After melting, the material was cast into a mold with a thickness of 10 mm to obtain sheet-form ingots. The ingots were then pulverized, and then finely pulverized to an average crystal grain size of 1 to 30 μm in a stamp mill and a jet mill. $N_2$ gas was used in the jet mill, and the pressure was 0.7 MPa.

The finely pulverized raw material powders were compression molded at a pressure of 200 MPa to sizes of 5×5×15 mm, 10×10×2 mm, and 10 (outside diameter)×2 mm, and these products were sintered in a vacuum for 5 hours at 1325K. The Seebeck coefficient, Hall coefficient (including carrier concentration and electrical conductivity), and thermal conductivity of each of the sinters thus obtained were measured by the same methods as in Example 4. Table 10 shows the measured values at 1100K and the Figure of merit (ZT=$S^2$T/ρκ).

Example 6

In order to produce p- and n-type silicon thermoelectric semiconductors, high-purity silicon (10N) and added elements were compounded as shown in Table 11, after which this product was put in a graphite crucible and vacuum melted in a high-frequency melting furnace. The melts were discharged through a nozzle with an inside diameter of 3 mm, and the melts were quenched by blowing argon gas on them at 3 MPa to obtain spherical atomized powder particles with an average diameter of 30 to 100 μm. The cooling rate of this atomized powder was 500 to 1000 K/sec, and the average crystal grain size was 1 to 30 μm.

The atomized powders thus obtained were sintered by discharge plasma in an argon atmosphere. The sintering conditions were 3 minutes at 1325K. The sample sinters were cut to sizes of 5×5×15 mm, 10×10×2 mm, and 10 (outside diameter)×2 mm, and the Seebeck coefficient, Hall coefficient (including carrier concentration and electrical conductivity), and thermal conductivity of each were measured by the same methods as in Example 4. Table 12 shows the measured values at 1100K and the Figure of merit (ZT=$S^2$T/ρκ).

TABLE 7

| No. | added element Bnc | Doping amount (at %) | Dopant Ap, An | Doping amount (at %) | Pulverization time (h) | Powder particle size (μm) | Sintering temp. (K) | Sintering time (h) |
|---|---|---|---|---|---|---|---|---|
| 1 |  |  | B | 0.3 | 20 | 10 | 1325 | 1 |
| 2 |  |  | Al | 1 | 20 | 10 | 1325 | 1 |
| 3 | Ge | 3 | B | 0.3 | 10 | 30 | 1325 | 1 |
| 4 | Ge | 3 | B | 0.3 | 20 | 10 | 1325 | 1 |
| 5 | Ge | 3 | B | 0.3 | 50 | 3 | 1325 | 1 |
| 6 | Ge | 3 | Ga | 1 | 20 | 10 | 1325 | 1 |
| 7 |  |  | P | 1 | 20 | 10 | 1325 | 1 |
| 8 |  |  | As | 1 | 20 | 10 | 1325 | 1 |
| 9 | Ge | 3 | P | 1 | 10 | 30 | 1325 | 1 |
| 10 | Ge | 3 | P | 1 | 20 | 10 | 1325 | 1 |
| 11 | Ge | 3 | P | 1 | 50 | 3 | 1325 | 1 |
| 12 | Ge | 3 | Sb | 3 | 20 | 10 | 1325 | 1 |

TABLE 8

| No. | Seebeck coefficient (mV/K) | Electrical resistivity ×10⁻⁵ (Ω · m) | Thermal conductivity (W/m · K) | Figure of merit (ZT) |
|---|---|---|---|---|
| 1 | 0.267 | 1.27 | 29 | 0.21 |
| 2 | 0.231 | 1.31 | 31 | 0.14 |
| 3 | 0.272 | 1.28 | 11 | 0.58 |
| 4 | 0.286 | 1.30 | 9 | 0.72 |
| 5 | 0.283 | 1.33 | 7 | 0.95 |
| 6 | 0.291 | 1.41 | 9 | 0.73 |
| 7 | −0.301 | 1.29 | 30 | 0.26 |
| 8 | −0.318 | 1.34 | 32 | 0.26 |
| 9 | −0.305 | 1.30 | 10 | 0.79 |
| 10 | −0.309 | 1.34 | 9 | 0.87 |
| 11 | −0.314 | 1.37 | 8 | 0.99 |
| 12 | −0.332 | 1.45 | 9 | 0.93 |

TABLE 9

| No. | added element Bnc | Doping amount (at %) | Dopant Ap, An | Doping amount (at %) | Raw material supply rate (g/sec) | Powder particle size (μm) | Sintering temp. (K) | Sintering time (h) |
|---|---|---|---|---|---|---|---|---|
| 21 |    |   | B  | 0.3 | 0.5  | 5  | 1300 | 5 |
| 22 |    |   | Al | 1   | 0.5  | 5  | 1300 | 5 |
| 23 | Ge | 3 | B  | 0.3 | 1    | 10 | 1300 | 5 |
| 24 | Ge | 3 | B  | 0.3 | 0.5  | 5  | 1300 | 5 |
| 25 | Ge | 3 | B  | 0.3 | 0.25 | 3  | 1300 | 5 |
| 26 | Ge | 3 | Ga | 1   | 0.5  | 5  | 1300 | 5 |
| 27 |    |   | P  | 1   | 0.5  | 5  | 1300 | 5 |
| 28 |    |   | As | 1   | 0.5  | 5  | 1300 | 5 |
| 29 | Ge | 3 | P  | 1   | 1    | 10 | 1300 | 5 |
| 30 | Ge | 3 | P  | 1   | 0.5  | 5  | 1300 | 5 |
| 31 | Ge | 3 | P  | 1   | 0.25 | 3  | 1300 | 5 |
| 32 | Ge | 3 | Sb | 3   | 0.5  | 5  | 1300 | 5 |

TABLE 10

| No. | Seebeck coefficient (mV/K) | Electrical resistivity ×10⁻⁵ (Ω·m) | Thermal conductivity (W/m·K) | Figure of merit (ZT) |
|---|---|---|---|---|
| 21 | 0.269  | 1.36 | 25 | 0.23 |
| 22 | 0.235  | 1.41 | 29 | 0.15 |
| 23 | 0.274  | 1.39 | 10 | 0.59 |
| 24 | 0.277  | 1.42 | 8  | 0.74 |
| 25 | 0.281  | 1.46 | 6  | 0.99 |
| 26 | 0.294  | 1.53 | 7  | 0.89 |
| 27 | −0.303 | 1.35 | 27 | 0.28 |
| 28 | −0.320 | 1.41 | 29 | 0.28 |
| 29 | −0.309 | 1.42 | 9  | 0.82 |
| 30 | −0.311 | 1.49 | 7  | 1.02 |
| 31 | −0.314 | 1.55 | 6  | 1.17 |
| 32 | −0.336 | 1.60 | 97 | 1.11 |

TABLE 11

| No. | added element Bnc | Doping amount (at %) | Spray Dopant Ap, An | Doping amount (at %) | pressure (MPa) | Powder particle size (μm) | Sintering temp. (K) | Sintering time (sec) |
|---|---|---|---|---|---|---|---|---|
| 41 |    |   | B  | 0.3 | 5 | 50 | 1325 | 180 |
| 42 |    |   | Al | 1   | 5 | 50 | 1325 | 180 |
| 43 | Ge | 3 | B  | 0.3 | 3 | 75 | 1325 | 180 |
| 44 | Ge | 3 | B  | 0.3 | 5 | 50 | 1325 | 180 |
| 45 | Ge | 3 | B  | 0.3 | 8 | 30 | 1325 | 180 |
| 46 | Ge | 3 | Ga | 1   | 5 | 50 | 1325 | 180 |
| 47 |    |   | P  | 1   | 5 | 50 | 1325 | 180 |
| 48 |    |   | As | 1   | 5 | 50 | 1325 | 180 |
| 49 | Ge | 3 | P  | 1   | 3 | 75 | 1325 | 180 |
| 50 | Ge | 3 | P  | 1   | 5 | 50 | 1325 | 180 |
| 51 | Ge | 3 | P  | 1   | 8 | 30 | 1325 | 180 |
| 52 | Ge | 3 | Sb | 3   | 5 | 50 | 1325 | 180 |

TABLE 12

| No. | Seebeck coefficient (mV/K) | Electrical resistivity ×10⁻⁵ (Ω·m) | Thermal conductivity (W/m·K) | Figure of merit (ZT) |
|---|---|---|---|---|
| 41 | 0.271  | 1.40 | 21 | 0.27 |
| 42 | 0.238  | 1.44 | 24 | 0.18 |
| 43 | 0.277  | 1.42 | 9  | 0.66 |
| 44 | 0.279  | 1.46 | 7  | 0.84 |
| 45 | 0.283  | 1.49 | 6  | 0.99 |
| 46 | 0.298  | 1.58 | 7  | 0.88 |
| 47 | −0.306 | 1.39 | 23 | 0.32 |
| 48 | −0.323 | 1.46 | 27 | 0.29 |
| 49 | −0.311 | 1.47 | 9  | 0.80 |
| 50 | −0.314 | 1.53 | 7  | 1.01 |
| 51 | −0.317 | 1.58 | 6  | 1.17 |
| 52 | −0.339 | 1.63 | 7  | 1.11 |

Example 7

In order to produce mother particles of silicon thermoelectric semiconductors, high-purity silicon or $Si_{0.97}Ge_{0.03}$ was put in a graphite crucible and vacuum melted in a high-frequency melting furnace. After melting, the material was cast into a mold with a thickness of 10 mm, and the ingots were ground and then pulverized to an average crystal grain size of 10 to 50 μm in a stamp mill and a ball mill. The ball mill was a wet type and made use of a xylene solvent. The ground powder (mother particles) was put in a vacuum chamber at $10^{-3}$ Torr, and the surface of the particles was coated (film thickness: 10 to 100 nm) with the carrier-generating dopants shown in Table 13.

The powder thus obtained was subjected to hot pressing in argon for 1 hour at 1325K and 100 MPa to obtain sinters. The sinter samples were cut to sizes of 5×5×15 mm, 10×10×2 mm, and 10 (outside diameter)×2 mm, and the Seebeck coefficient, Hall coefficient (including carrier concentration and electrical conductivity), and thermal conductivity of each were measured. Table 14 shows the measured values at 1100K and the Figure of merit (ZT=S2T/ρκ).

Example 8

In order to produce mother particles of p- and n-type silicon thermoelectric semiconductors, high-purity silicon or $Si_{0.97}Ge_{0.03}$ was put in a graphite crucible and vacuum melted in a high-frequency melting furnace. After melting, the material was cast into a mold with a thickness of 10 mm to obtain sheet-form ingots. The ingots were then pulverized, and then finely pulverized to an average crystal grain size of 1 to 10 μm in a stamp mill and a jet mill. $N_2$ gas was used in the jet mill, and the pressure was 0.7 MPa.

The powders (mother particles) thus obtained were put in a vacuum chamber and treated with $SiH_4$ gas or $GeH_4$ gas, and the powders were coated with dopants that generate carriers, such as boron, aluminum, gallium, phosphorus, arsenic, and antimony in the film thicknesses shown in Table 15.

The coated raw material powders were compression molded at a pressure of 200 MPa to sizes of 5×5×15 mm, 10×10×2 mm, and 10 (outside diameter)×2 mm, and these products were sintered in a vacuum for 5 hours at 1325K. The Seebeck coefficient, Hall coefficient (including carrier concentration and electrical conductivity), and thermal conductivity of each of the sinters thus obtained were measured by the same methods as in Example 1. Table 16 shows the measured values at 1100K and the Figure of merit (ZT= $S^2T/\rho\kappa$).

Example 9

In order to produce mother particles of silicon thermoelectric cemiconductors, high-purity silicon (10N) was put in a graphite crucible and vacuum melted in a high-frequency melting furnace. The melt was cast into a mold with a thickness of 10 mm to obtain sheet-form ingots. The ingots were ground and then finely pulverized to an average crystal grain size of 10 to 50 μm in a stamp mill and a ball mill. The ball mill was a wet type and made use of a xylene solvent.

Added elements for producing daughter particles forming a coating around the silicon were compounded as shown in Table 17, after which the material was put in a graphite crucible and vacuum melted in a high-frequency melting furnace. The melt discharged through a nozzle with an inside diameter of 3 mm, and the melts were quenched by blowing argon gas on them at 3 MPa, resulting in an average diameter of 30 to 100 μm. The obtained mother particles were coated with the daughter particles by mechanofusion such that the daughter particles were in a specific weight ratio.

The coated raw material powders were sintered by discharge plasma in an argon atmosphere. The sintering conditions were 180 seconds at 1325K. The sample sinters were cut to sizes of 5×5×15 mm, 10×10×2 mm, and 10 (outside diameter)×2 mm, and the Seebeck coefficient, Hall coefficient (including carrier concentration and electrical conductivity), and thermal conductivity of each were measured by the same methods as in Example 1. Table 18 shows the measured values at 1100K and the Figure of merit (ZT=$S^2T/\rho\kappa$).

TABLE 13

| No. | Composition of mother particles | Diameter of mother particles (μm) | Dopant | Coating film thickness (nm) | Sintering temp. (K) | Sintering time (h) |
|---|---|---|---|---|---|---|
| 1 | Si | 10 | B | 10 | 1325 | 1 |
| 2 | Si | 30 | B | 30 | 1325 | 1 |
| 3 | Si | 30 | Al | 50 | 1325 | 1 |
| 4 | Si 0.97 Ge 0.03 | 10 | B | 10 | 1325 | 1 |
| 5 | Si 0.97 Ge 0.03 | 30 | B | 30 | 1325 | 1 |
| 6 | Si 0.97 Ge 0.03 | 30 | Ga | 50 | 1325 | 1 |
| 7 | Si | 10 | P | 30 | 1325 | 1 |
| 8 | Si | 30 | P | 60 | 1325 | 1 |
| 9 | Si | 30 | As | 90 | 1325 | 1 |
| 10 | Si 0.97 Ge 0.03 | 10 | P | 30 | 1325 | 1 |
| 11 | Si 0.97 Ge 0.03 | 30 | P | 60 | 1325 | 1 |
| 12 | Si 0.97 Ge 0.03 | 30 | Sb | 90 | 1325 | 1 |

TABLE 14

| No. | Seebeck coefficient (mV/K) | Electrical resistivity ×10⁻⁵ (Ω · m) | Thermal conductivity (W/m · K) | Figure of merit (ZT) |
|---|---|---|---|---|
| 1 | 0.267 | 1.31 | 29 | 0.21 |
| 2 | 0.259 | 1.28 | 31 | 0.19 |
| 3 | 0.234 | 1.41 | 35 | 0.12 |
| 4 | 0.271 | 1.35 | 9 | 0.66 |
| 5 | 0.269 | 1.33 | 11 | 0.54 |
| 6 | 0.289 | 1.42 | 10 | 0.65 |
| 7 | −0.301 | 1.30 | 30 | 0.26 |
| 8 | −0.299 | 1.28 | 32 | 0.24 |
| 9 | −0.293 | 1.32 | 37 | 0.19 |
| 10 | −0.309 | 1.34 | 9 | 0.87 |
| 11 | −0.306 | 1.30 | 10 | 0.79 |
| 12 | −0.329 | 1.48 | 10 | 0.80 |

TABLE 15

| No. | Composition of mother particles | Diameter of mother particles (μm) | Dopant | Coating film thickness (nm) | Sintering temp. (K) | Sintering time (h) |
|---|---|---|---|---|---|---|
| 21 | Si | 3 | B | 3 | 1325 | 5 |
| 22 | Si | 10 | B | 10 | 1325 | 5 |
| 23 | Si | 10 | Al | 15 | 1325 | 5 |
| 24 | Si 0.97 Ge 0.03 | 3 | B | 3 | 1325 | 5 |
| 25 | Si 0.97 Ge 0.03 | 10 | B | 10 | 1325 | 5 |
| 26 | Si 0.97 Ge 0.03 | 10 | Ga | 15 | 1325 | 5 |
| 27 | Si | 3 | P | 10 | 1325 | 5 |
| 28 | Si | 10 | P | 20 | 1325 | 5 |
| 29 | Si | 10 | As | 30 | 1325 | 5 |
| 30 | Si 0.97 Ge 0.03 | 3 | P | 10 | 1325 | 5 |
| 31 | Si 0.97 Ge 0.03 | 10 | P | 20 | 1325 | 5 |
| 32 | Si 0.97 Ge 0.03 | 10 | Sb | 30 | 1325 | 5 |

TABLE 16

| No. | Seebeck coefficient (mV/K) | Electrical resistivity ×10$^{-5}$ (Ω·m) | Thermal conductivity (W/m·K) | Figure of merit (ZT) |
|---|---|---|---|---|
| 21 | 0.271 | 1.39 | 24 | 0.24 |
| 22 | 0.262 | 1.31 | 29 | 0.20 |
| 23 | 0.237 | 1.46 | 31 | 0.14 |
| 24 | 0.273 | 1.40 | 8 | 0.73 |
| 25 | 0.271 | 1.37 | 10 | 0.59 |
| 26 | 0.291 | 1.46 | 10 | 0.64 |
| 27 | −0.303 | 1.35 | 26 | 0.29 |
| 28 | −0.301 | 1.32 | 29 | 0.26 |
| 29 | −0.295 | 1.37 | 32 | 0.22 |
| 30 | −0.311 | 1.39 | 8 | 0.96 |
| 31 | −0.309 | 1.36 | 9 | 0.86 |
| 32 | −0.331 | 1.52 | 9 | 0.88 |

TABLE 17

| No. | Composition of mother particles | Diameter of mother particles (μm) | Composition of daughter particles | Diameter of daughter particles (μm) | Sintering temp. (K) | Sintering time (sec) |
|---|---|---|---|---|---|---|
| 41 | Si | 10 | B | 1 | 1325 | 180 |
| 42 | Si | 30 | B | 3 | 1325 | 180 |
| 43 | Si | 30 | Al | 3 | 1325 | 180 |
| 44 | Si | 10 | Ge 0.9 B 0.1 | 1 | 1325 | 180 |
| 45 | Si | 30 | Ge 0.9 B 0.1 | 3 | 1325 | 180 |
| 46 | Si | 30 | Ge 0.9 Ga 0.1 | 3 | 1325 | 180 |
| 47 | Si | 10 | P | 1 | 1325 | 180 |
| 48 | Si | 30 | P | 3 | 1325 | 180 |
| 49 | Si | 30 | As | 3 | 1325 | 180 |
| 50 | Si | 10 | Ge 0.8 P 0.2 | 1 | 1325 | 180 |
| 51 | Si | 30 | Ge 0.8 P 0.2 | 3 | 1325 | 180 |
| 52 | Si | 30 | Ge 0.8 Sb 0.2 | 3 | 1325 | 180 |

TABLE 18

| No. | Seebeck coefficient (mV/K) | Electrical resistivity ×10$^{-5}$ (Ω·m) | Thermal conductivity (W/m·K) | Figure of merit (ZT) |
|---|---|---|---|---|
| 41 | 0.273 | 1.40 | 28 | 0.21 |
| 42 | 0.265 | 1.33 | 31 | 0.19 |
| 43 | 0.240 | 1.49 | 33 | 0.13 |
| 44 | 0.275 | 1.42 | 9 | 0.65 |
| 45 | 0.274 | 1.39 | 10 | 0.59 |
| 46 | 0.294 | 1.48 | 10 | 0.64 |
| 47 | −0.304 | 1.37 | 28 | 0.27 |
| 48 | −0.302 | 1.35 | 30 | 0.25 |
| 49 | −0.297 | 1.39 | 33 | 0.21 |
| 50 | −0.314 | 1.41 | 9 | 0.85 |
| 51 | −0.312 | 1.39 | 10 | 0.77 |
| 52 | −0.333 | 1.54 | 10 | 0.79 |

Example 10

A silicon (111) wafer was put in a vacuum chamber at 10$^{-6}$ Torr, the added elements shown in Table 19 were formed by electron beam heating alternately as layer A and layer B for 50 laminations in the thicknesses shown in Table 19.

The samples on the silicon wafers thus obtained were cut to sizes of 5×15 mm, 10×10 mm, and 10 mm (outside diameter), and the Seebeck coefficient, Hall coefficient (including carrier concentration and electrical conductivity), and thermal conductivity of each were measured along with the silicon wafer. Table 20 shows the measured values at 1100K and the Figure of merit (ZT=S$^2$T/ρκ).

The temperature differential between the high and low temperature portions during temperature elevation was set to be about 6K, the thermoelectromotive force of the samples was measured with a digital multimeter, and this value was divided by the temperature differential to find the Seebeck coefficient. The Hall coefficient was measured by AC method, and the electrical resistance was measured by four-probe method simultaneously with the carrier concentration. The thermal conductivity was measured by laser flash method.

Example 11

A silicon (111) wafer was put in a vacuum chamber at $10^{-2}$ Torr, the added elements shown in Table 21 were formed by sputtering alternately as layer A and layer B for 50 laminations in the thicknesses shown in Table 21.

The samples on the silicon wafers thus obtained were cut to sizes of 5×15 mm, 10×10 mm, and 10 mm (outside diameter), and the Seebeck coefficient, Hall coefficient (including carrier concentration and electrical conductivity), and thermal conductivity of each were measured along with the silicon wafer. Table 22 shows the measured values at 1100K and the Figure of merit ($ZT=S^2T/\rho\kappa$).

TABLE 19

| No. | Composition of layer A | Layer A thickness (nm) | Composition of layer B | Layer B thickness (nm) | Cycles (times) | Heating temp. (K) | Heating time (h) |
|---|---|---|---|---|---|---|---|
| 1 | Si | 20 | B | 1 | 50 | 873 | 1 |
| 2 | Si | 50 | B | 3 | 50 | 873 | 1 |
| 3 | Si | 50 | Al | 3 | 50 | 873 | 1 |
| 4 | Si | 20 | Ge 0.9 B 0.1 | 1 | 50 | 873 | 1 |
| 5 | Si | 50 | Ge 0.9 B 0.1 | 3 | 50 | 873 | 1 |
| 6 | Si | 50 | Ge 0.8 Ga 0.2 | 3 | 50 | 873 | 1 |
| 7 | Si | 20 | P | 2 | 50 | 873 | 1 |
| 8 | Si | 50 | P | 5 | 50 | 873 | 1 |
| 9 | Si | 50 | As | 5 | 50 | 873 | 1 |
| 10 | Si | 20 | Ge 0.8 P 0.2 | 2 | 50 | 873 | 1 |
| 11 | Si | 50 | Ge 0.8 P 0.2 | 5 | 50 | 873 | 1 |
| 12 | Si | 50 | Ge 0.8 Sb 0.2 | 5 | 50 | 873 | 1 |

TABLE 20

| No. | Seebeck coefficient (mV/K) | Electrical resistivity ×10$^{-5}$ (Ω · m) | Thermal conductivity (W/m · K) | Figure of merit (ZT) |
|---|---|---|---|---|
| 1 | 0.273 | 1.51 | 21 | 0.26 |
| 2 | 0.264 | 1.47 | 24 | 0.22 |
| 3 | 0.241 | 1.75 | 29 | 0.13 |
| 4 | 0.278 | 1.59 | 7 | 0.76 |
| 5 | 0.276 | 1.49 | 8 | 0.70 |
| 6 | 0.295 | 1.82 | 8 | 0.66 |
| 7 | −0.309 | 1.62 | 19 | 0.34 |
| 8 | −0.306 | 1.53 | 21 | 0.32 |
| 9 | −0.300 | 1.64 | 28 | 0.22 |
| 10 | −0.316 | 1.57 | 7 | 1.00 |
| 11 | −0.312 | 1.53 | 8 | 0.87 |
| 12 | −0.334 | 1.67 | 8 | 0.92 |

TABLE 21

| No. | Composition of layer A | Layer A thickness (nm) | Composition of layer B | Layer B thickness (nm) | Cycles (times) | Heating temp. (K) | Heating time (h) |
|---|---|---|---|---|---|---|---|
| 21 | Si | 20 | B | 1 | 50 | 873 | 1 |
| 22 | Si | 50 | B | 3 | 50 | 873 | 1 |
| 23 | Si | 50 | Al | 3 | 50 | 873 | 1 |
| 24 | Si 0.9 Ge 0.1 | 20 | B | 1 | 50 | 873 | 1 |
| 25 | Si 0.9 Ge 0.1 | 50 | B | 3 | 50 | 873 | 1 |
| 26 | Si 0.9 Ge 0.1 | 50 | Ga | 3 | 50 | 873 | 1 |
| 27 | Si | 20 | P | 2 | 50 | 873 | 1 |
| 28 | Si | 50 | P | 5 | 50 | 873 | 1 |
| 29 | Si | 50 | As | 5 | 50 | 873 | 1 |
| 30 | Si 0.9 Ge 0.1 | 20 | P | 2 | 50 | 873 | 1 |
| 31 | Si 0.9 Ge 0.1 | 50 | P | 5 | 50 | 873 | 1 |
| 32 | Si 0.9 Ge 0.1 | 50 | Sb | 5 | 50 | 873 | 1 |

TABLE 22

| No. | Seebeck coefficient (mV/K) | Electrical resistivity ×10⁻⁵ ($\Omega \cdot m$) | Thermal conductivity (W/m·K) | Figure of merit (ZT) |
|---|---|---|---|---|
| 21 | 0.269 | 1.41 | 23 | 0.25 |
| 22 | 0.261 | 1.37 | 25 | 0.22 |
| 23 | 0.237 | 1.64 | 30 | 0.13 |
| 24 | 0.272 | 1.49 | 8 | 0.68 |
| 25 | 0.270 | 1.40 | 9 | 0.64 |
| 26 | 0.290 | 1.72 | 9 | 0.60 |
| 27 | −0.301 | 1.52 | 21 | 0.31 |
| 28 | −0.299 | 1.43 | 23 | 0.30 |
| 29 | −0.294 | 1.54 | 29 | 0.21 |
| 30 | −0.311 | 1.47 | 8 | 0.90 |
| 31 | −0.306 | 1.43 | 9 | 0.80 |
| 32 | −0.328 | 1.57 | 9 | 0.84 |

Example 12

In order to produce a p-type silicon thermoelectric semiconductor, high-purity silicon (10N), a Group IV element (germanium, carbon, or tin, the added element Bnc that does not generate carriers), and a Group III element (the dopant Ap or An that does generate carriers) were compounded as shown in Table 23, after which they were arc melted in an argon gas atmosphere. The button-shaped ingots thus obtained were cut to sizes of 5×5×15 mm, 10×10×2 mm, and 10 (diameter)×2 mm, and the Seebeck coefficient (S), Hall coefficient (including the carrier concentration (n) and electrical conductivity (ρ)), and thermal conductivity (κ) were measured for each.

The temperature differential between the high and low temperature portions was set to 6K, the thermoelectromotive force of the p-type semiconductors in which the average temperature between the high and low temperature portions was 200° C. (473K) was measured with a digital multimeter, and this value was divided by the temperature differential (6K) to find the Seebeck coefficient. The Hall coefficient was measured by applying an AC magnetic field of 0.4 T at 473K, and the electrical resistance was measured by four-probe method simultaneously with the carrier concentration. The thermal conductivity was measured at 473K by laser flash method.

Tables 23 and 24 show the obtained measurement values and the Figure of merit ($Z=S^2/\rho\kappa$). The measurement values of an Si—Ge alloy (containing 30 at % germanium) and of silicon not doped with germanium are also shown as comparative examples.

Example 13

In order to produce an n-type silicon thermoelectric semiconductor, high-purity silicon (10N), a Group IV element (germanium, carbon, or tin, the added element Bnc that does not generate carriers), and a Group V element (the dopant Ap or An that does generate carriers) were compounded as shown in Table 24, after which they were arc melted in an argon gas atmosphere. The button-shaped ingots thus obtained were cut to sizes of 5×5×5 mm, 10×10×2 mm, and 10 (diameter)×2 mm.

The Seebeck coefficient (S), Hall coefficient (including the carrier concentration (n) and electrical conductivity (ρ)), and thermal conductivity (κ) were measured for each in the same manner as in Example 1. Tables 25 and 26 show the obtained measurement values and the Figure of merit ($Z=S^2/\rho\kappa$). As a comparative material, measurement values are also given for an Si—Ge alloy (30 at % germanium) and silicon to which no germanium was added.

Example 14

In order to produce p- and n-type silicon thermoelectric semiconductors, high-purity silicon (10N), a Group IV element (germanium, carbon, or tin, the added element Bnc1 that does not generate carriers), a Group III–V compound semiconductor (GaP, GaAs) or a Group II–V compound semiconductor (ZnS) (the compound semiconductor is the added element Bnc2 that does not generate carriers), and a Group II element and Group III element, or a Group V element and Group VI element that do generate carriers were compounded as shown in Table 25, after which they were melted in a high-frequency melting furnace in a 40 kPa argon gas atmosphere.

The ingots thus obtained were cut to sizes of 5×5×5 mm, 10×10×2 mm, and 10 (diameter)×2 mm. The Seebeck coefficient (S), Hall coefficient (including the carrier concentration (n) and electrical conductivity (ρ)), and thermal conductivity (K) were measured for each. Table 27 and 28 show the obtained measurement values and the Figure of merit ($Z=S^2/\rho\kappa$). As a comparative material, measurement values are also given for an Si—Ge alloy (6.5 at % germanium) to which no Group III–V compound semiconductor or Group II–VI compound semiconductor was added.

TABLE 23

| | No. | Matrix | Added element Bnc Element name | Doping amount (at %) | Dopant Ap, An Element name | Doping amount (at %) | Carrier concentration n (M/m³) |
|---|---|---|---|---|---|---|---|
| Example | 1 | Si | Ge | 5 | B | 0.3 | $1.82 \times 10^{+20}$ |
| | 2 | Si | Ge | 6.5 | B | 0.3 | $1.78 \times 10^{+20}$ |
| | 3 | Si | Ge | 8 | Al | 0.3 | $1.65 \times 10^{+20}$ |
| | 4 | Si | Ge | 10 | B | 0.3 | $1.68 \times 10^{+20}$ |
| | 5 | Si | Ge | 10 | B + Al | 0.3 + 0.5 | $4.71 \times 10^{+20}$ |
| | 6 | Si | C | 6.5 | B | 0.3 | $1.72 \times 10^{+20}$ |
| | 7 | Si | C | 8 | Al | 0.3 | $1.77 \times 10^{+20}$ |
| | 8 | Si | Sn | 6.5 | B | 0.3 | $1.62 \times 10^{+20}$ |
| Comparative Example | 9 | Si | Ge | 3 | B | 0.3 | $1.90 \times 10^{+20}$ |
| | 10 | Si | Ge | 12 | B | 0.3 | $1.65 \times 10^{+20}$ |
| | 11 | Si | Ge | 20 | B | 0.3 | $1.54 \times 10^{+20}$ |
| | 12 | Si | Ge | 30 | B | 0.3 | $1.59 \times 10^{+20}$ |
| | 13 | Si | — | — | B | 0.3 | $2.00 \times 10^{+20}$ |

TABLE 24

| | No. | Thermoelectric characteristics Seebeck coefficient S (mV/K) | Electrical resistance ρ (Ω·m) | Thermal conductivity κ (W/m·K) | Figure of merit (/K) |
|---|---|---|---|---|---|
| Example | 1 | 0.30 | $7.70 \times 10^{-6}$ | 8.2 | $1.4 \times 10^{-3}$ |
| | 2 | 0.32 | $7.90 \times 10^{-6}$ | 7.6 | $1.7 \times 10^{-3}$ |
| | 3 | 0.34 | $8.10 \times 10^{-6}$ | 7.2 | $2.0 \times 10^{-3}$ |
| | 4 | 0.33 | $8.30 \times 10^{-6}$ | 6.8 | $1.9 \times 10^{-3}$ |
| | 5 | 0.20 | $4.20 \times 10^{-6}$ | 5.3 | $1.8 \times 10^{-3}$ |
| | 6 | 0.27 | $6.90 \times 10^{-6}$ | 10.0 | $1.1 \times 10^{-3}$ |
| | 7 | 0.26 | $7.40 \times 10^{-6}$ | 8.5 | $1.1 \times 10^{-3}$ |
| | 8 | 0.29 | $8.20 \times 10^{-6}$ | 10.9 | $9.4 \times 10^{-4}$ |
| Comparative Example | 9 | 0.29 | $7.60 \times 10^{-6}$ | 14.0 | $7.9 \times 10^{-4}$ |
| | 10 | 0.26 | $9.40 \times 10^{-6}$ | 6.8 | $1.0 \times 10^{-3}$ |
| | 11 | 0.24 | $9.90 \times 10^{-6}$ | 6.6 | $8.8 \times 10^{-4}$ |
| | 12 | 0.22 | $8.70 \times 10^{-6}$ | 6.3 | $8.8 \times 10^{-4}$ |
| | 13 | 0.33 | $7.30 \times 10^{-6}$ | 65.0 | $2.3 \times 10^{-4}$ |

TABLE 25

| | No. | Matrix | Added element Bnc Element name | Doping amount (at %) | Dopant Ap, An Element name | Doping amount (at %) | Carrier concentration n (M/m³) |
|---|---|---|---|---|---|---|---|
| Example | 21 | Si | Ge | 5 | P | 1.0 | $1.92 \times 10^{+20}$ |
| | 22 | Si | Ge | 6.5 | P | 1.0 | $1.84 \times 10^{+20}$ |
| | 23 | Si | Ge | 8 | As | 1.0 | $1.69 \times 10^{+20}$ |
| | 24 | Si | Ge | 10 | P | 1.0 | $1.73 \times 10^{+20}$ |
| | 25 | Si | Ge | 10 | P + Sb | 3.0 + 5.0 | $4.01 \times 10^{+20}$ |
| | 26 | Si | C | 6.5 | P | 1.0 | $1.85 \times 10^{+20}$ |
| | 27 | Si | C | 8 | Bi | 1.0 | $1.76 \times 10^{+20}$ |
| | 28 | Si | Sn | 6.5 | P | 1.0 | $1.82 \times 10^{+20}$ |
| Comparative Example | 29 | Si | Ge | 3 | P | 1.0 | $1.98 \times 10^{+20}$ |
| | 30 | Si | Ge | 12 | P | 1.0 | $1.67 \times 10^{+20}$ |
| | 31 | Si | Ge | 20 | P | 1.0 | $1.61 \times 10^{+20}$ |
| | 32 | Si | Ge | 30 | P | 1.0 | $1.62 \times 10^{+20}$ |
| | 33 | Si | — | — | P | 1.0 | $2.08 \times 10^{+20}$ |

TABLE 26

| | No. | Thermoelectric characteristics Seebeck coefficient S (mV/K) | Electrical resistance ρ (Ω·m) | Thermal conductivity κ (W/m·K) | Figure of merit (/K) |
|---|---|---|---|---|---|
| Example | 21 | −0.31 | $7.90 \times 10^{-6}$ | 9.3 | $1.3 \times 10^{-4}$ |
| | 22 | −0.34 | $8.20 \times 10^{-6}$ | 8.2 | $1.7 \times 10^{-3}$ |
| | 23 | −0.37 | $8.40 \times 10^{-6}$ | 7.5 | $2.2 \times 10^{-3}$ |
| | 24 | −0.35 | $8.60 \times 10^{-6}$ | 7.0 | $2.0 \times 10^{-3}$ |
| | 25 | −0.24 | $3.90 \times 10^{-6}$ | 6.3 | $2.3 \times 10^{-3}$ |
| | 26 | −0.29 | $7.20 \times 10^{-6}$ | 10.6 | $1.1 \times 10^{-3}$ |
| | 27 | −0.30 | $7.70 \times 10^{-6}$ | 8.8 | $1.3 \times 10^{-3}$ |
| | 28 | −0.31 | $8.20 \times 10^{-6}$ | 11.2 | $1.0 \times 10^{-3}$ |
| Comparative Example | 29 | −0.31 | $7.90 \times 10^{-6}$ | 13.2 | $9.2 \times 10^{-4}$ |
| | 30 | −0.27 | $1.02 \times 10^{-5}$ | 6.9 | $1.0 \times 10^{-3}$ |
| | 31 | −0.25 | $1.04 \times 10^{-5}$ | 6.7 | $9.0 \times 10^{-4}$ |
| | 32 | −0.24 | $9.00 \times 10^{-6}$ | 6.5 | $9.8 \times 10^{-4}$ |
| | 33 | −0.35 | $7.80 \times 10^{-6}$ | 58.0 | $2.7 \times 10^{-4}$ |

TABLE 27

|  | No. | Matrix | Added element Bnc1 Element name | Added element Bnc1 Doping amount (at %) | Added element Bnc2 Element name | Added element Bnc2 Doping amount (at %) | Dopant Ap, An Element name | Dopant Ap, An Doping amount (at %) | Carrier concentration n (M/m³) ×10²⁰ |
|---|---|---|---|---|---|---|---|---|---|
| Example | 41 | Si | Ge | 6.5 | GaP | 3.0 | B | 0.6 | 1.87 |
|  | 42 | Si | Ge | 6.5 | GaP | 3.0 | P | 1.0 | 2.01 |
|  | 43 | Si | Ge | 6.5 | GaP | 5.0 | B | 0.6 | 1.84 |
|  | 44 | Si | Ge | 6.5 | GaP | 5.0 | P | 1.0 | 2.03 |
|  | 45 | Si | Ge | 6.5 | GaAs | 3.0 | Al | 0.6 | 1.85 |
|  | 46 | Si | Ge | 6.5 | GaAs | 3.0 | As | 1.0 | 1.99 |
|  | 47 | Si | Ge | 6.5 | ZnS | 3.0 | Be | 0.3 | 1.79 |
|  | 48 | Si | Ge | 6.5 | ZnS | 3.0 | S | 1.0 | 1.96 |
| Comparative Example | 49 | Si | Ge | 6.5 | — | — | B | 0.3 | 1.79 |
|  | 50 | Si | Ge | 6.5 | — | — | P | 1.0 | 1.86 |

TABLE 28

|  | No. | Thermoelectric characteristics Seebeck coefficient S (mV/K) | Thermoelectric characteristics Electrical resistance ρ (Ω·m) | Thermoelectric characteristics Thermal conductivity κ (W/m·K) | Figure of merit (/K) |
|---|---|---|---|---|---|
| Example | 41 | 0.36 | $8.40 \times 10^{-6}$ | 7.2 | $2.1 \times 10^{-3}$ |
|  | 42 | −0.36 | $7.20 \times 10^{-6}$ | 7.9 | $2.3 \times 10^{-3}$ |
|  | 43 | 0.37 | $8.80 \times 10^{-6}$ | 6.9 | $2.3 \times 10^{-3}$ |
|  | 44 | −0.38 | $6.90 \times 10^{-6}$ | 7.6 | $2.8 \times 10^{-3}$ |
|  | 45 | 0.34 | $8.80 \times 10^{-5}$ | 7.5 | $1.8 \times 10^{-3}$ |
|  | 46 | −0.35 | $7.30 \times 10^{-6}$ | 7.8 | $2.2 \times 10^{-3}$ |
|  | 47 | −0.39 | $9.30 \times 10^{-6}$ | 7.4 | $2.2 \times 10^{-3}$ |
|  | 48 | −0.38 | $7.70 \times 10^{-6}$ | 7.9 | $2.4 \times 10^{-3}$ |
| Comparative Example | 49 | 0.32 | $7.90 \times 10^{-6}$ | 7.6 | $1.7 \times 10^{-3}$ |
|  | 50 | −0.34 | $8.20 \times 10^{-6}$ | 8.2 | $1.7 \times 10^{-3}$ |

Example 15

In order to produce a p-type silicon thermoelectric semiconductor, high-purity silicon (10N), germanium, and a dopant that generates carriers were weighed out in the specific proportions shown in Table 29, after which they were arc melted in an argon gas atmosphere. The button-shaped ingots thus obtained were coarsely ground, then ground in a disk mill, then ground in a jet mill to produce powders with the average particle sizes show in Table 29.

After this, the hot pressing conditions shown in Table 30 were maintained for 1 hour to produce sinters having the various porosities shown in Table 30. The discharge plasma sintering conditions shown in Table 31 were then maintained for 3 minutes to produce sinters having the various porosities shown in Table 31. An SPS-2040 made by IzumiTech Ltd. was used for the discharge plasma sintering apparatus.

The sinters thus obtained were cut to sizes of 5×5×5 mm, 10×10×2 mm, and 10 (outside diameter)×2 mm to produce samples for measuring the Seebeck coefficient, Hall coefficient (including the carrier concentration and electrical conductivity), and thermal conductivity of each.

Using platinum for both the electrode in the high temperature portion and the electrode in the low temperature portion, the temperature differential between these electrodes was set to 6K, the thermoelectromotive force of the p-type semiconductors in which the average temperature between the high and low temperature portions was 323K was measured, and this thermoelectromotive force was divided by 6K to find the Seebeck coefficient.

The Hall coefficient was measured by AC method at 323K, and the electrical resistivity was also measured by four-probe method at that time. The thermal conductivity was measured at 323K by laser flash method. These measurement results are given in Tables 30 and 31.

TABLE 29

|  | Sample No | Composition (at %) Si | Composition (at %) Ge | Dopant Element | Dopant Doping amount (at %) | Carrier concentration (M/cm³) | Average pulverized particle size (μm) | Electrode type |
|---|---|---|---|---|---|---|---|---|
| Example 1 | A | 99.5 | 0.5 | B | 0.2 | $9.2 \times 10^{19}$ | 4.2 | P |
|  | B | 95.0 | 5.0 | B | 0.3 | $1.5 \times 10^{20}$ | 3.8 | P |
|  | C | 95.0 | 5.0 | P | 0.4 | $1.8 \times 10^{20}$ | 4.0 | N |
|  | D | 80.0 | 20.0 | GaP | 0.4 | $2.2 \times 10^{20}$ | 4.5 | N |
|  |  |  |  | P | 0.3 |  |  |  |
|  | E | 70.0 | 30.0 | B | 0.3 | $1.2 \times 10^{20}$ | 4.8 | P |

TABLE 30

| No. | Sample | Electrode type | Hot pressing conditions Temp. (K) | Hot pressing conditions Pressure (MPa) | Porosity (%) | Seebeck coefficient (mV/K) | Electrical resistivity (Ω · m) | Thermal conductivity (W/mK) | Figure of merit (1/K) |
|---|---|---|---|---|---|---|---|---|---|
| 1 | A | P | — | — | 0 | 0.096 | $6.68 \times 10^{-6}$ | 54.0 | $2.5 \times 10^{-5}$ |
| 2 | A | P | 1573 | 147 | 5 | 0.091 | $7.12 \times 10^{-6}$ | 32.1 | $3.6 \times 10^{-5}$ |
| 3 | A | P | 1573 | 49 | 8 | 0.087 | $7.65 \times 10^{-6}$ | 27.5 | $3.6 \times 10^{-5}$ |
| 4 | A | P | 1543 | 49 | 22 | 0.080 | $8.14 \times 10^{-6}$ | 21.3 | $3.7 \times 10^{-5}$ |
| 5 | B | P | — | — | 0 | 0.142 | $1.11 \times 10^{-5}$ | 8.75 | $2.1 \times 10^{-4}$ |
| 6 | B | P | 1553 | 147 | 8 | 0.136 | $1.32 \times 10^{-5}$ | 5.18 | $2.7 \times 10^{-4}$ |
| 7 | B | P | 1523 | 49 | 23 | 0.124 | $1.47 \times 10^{-5}$ | 3.72 | $2.8 \times 10^{-4}$ |
| 8 | B | P | 1493 | 49 | 40 | 0.113 | $1.92 \times 10^{-5}$ | 2.81 | $2.4 \times 10^{-4}$ |
| 9 | C | N | — | — | 0 | 0.168 | $9.31 \times 10^{-6}$ | 10.2 | $3.0 \times 10^{-4}$ |
| 10 | C | N | 1553 | 147 | 10 | 0.149 | $9.84 \times 10^{-6}$ | 6.53 | $3.5 \times 10^{-4}$ |
| 11 | C | N | 1523 | 49 | 22 | 0.137 | $1.13 \times 10^{-5}$ | 4.01 | $4.1 \times 10^{-4}$ |
| 12 | C | N | 1493 | 49 | 31 | 0.131 | $1.32 \times 10^{-5}$ | 3.42 | $3.8 \times 10^{-4}$ |
| 13 | C | N | 1463 | 49 | 41 | 0.124 | $1.65 \times 10^{-5}$ | 3.25 | $2.9 \times 10^{-4}$ |
| 14 | D | N | — | — | 0 | 0.141 | $6.10 \times 10^{-6}$ | 5.10 | $6.4 \times 10^{-4}$ |
| 15 | D | N | 1503 | 147 | 11 | 0.133 | $6.42 \times 10^{-6}$ | 3.80 | $7.3 \times 10^{-4}$ |
| 16 | D | N | 1473 | 49 | 27 | 0.121 | $7.15 \times 10^{-6}$ | 3.04 | $6.7 \times 10^{-4}$ |
| 17 | D | N | 1423 | 147 | 34 | 0.115 | $8.04 \times 10^{-6}$ | 2.53 | $6.5 \times 10^{-4}$ |
| 18 | D | N | 1403 | 49 | 43 | 0.101 | $9.04 \times 10^{-6}$ | 2.36 | $4.8 \times 10^{-4}$ |
| 19 | E | P | — | — | 0 | 0.121 | $8.51 \times 10^{-6}$ | 5.37 | $3.2 \times 10^{-4}$ |
| 20 | E | P | 1473 | 147 | 8 | 0.110 | $9.13 \times 10^{-6}$ | 4.62 | $2.9 \times 10^{-4}$ |
| 21 | E | P | 1443 | 49 | 24 | 0.104 | $9.97 \times 10^{-6}$ | 3.68 | $2.9 \times 10^{-4}$ |
| 22 | E | P | 1393 | 49 | 41 | 0.093 | $1.29 \times 10^{-6}$ | 2.54 | $2.6 \times 10^{-4}$ |

TABLE 31

| No. | Sample | Electrode type | Discharge plasma sintering conditions Temp. (K) | Discharge plasma sintering conditions Pressure (MPa) | Porosity (%) | Seebeck coefficient (mV/K) | Electrical resistivity (Ω · m) | Thermal conductivity (W/mK) | Figure of merit (1/K) |
|---|---|---|---|---|---|---|---|---|---|
| 1 | A | P | — | — | 0 | 0.096 | $6.68 \times 10^{-6}$ | 54.0 | $2.5 \times 10^{-5}$ |
| 23 | A | P | 1573 | 49 | 23 | 0.080 | $8.16 \times 10^{-6}$ | 21.3 | $3.7 \times 10^{-5}$ |
| 24 | A | P | 1543 | 49 | 34 | 0.072 | $8.74 \times 10^{-6}$ | 18.4 | $3.2 \times 10^{-5}$ |
| 5 | B | P | — | — | 0 | 0.142 | $1.11 \times 10^{-5}$ | 8.75 | $2.1 \times 10^{-4}$ |
| 25 | B | P | 1553 | 49 | 18 | 0.131 | $1.36 \times 10^{-5}$ | 4.14 | $3.0 \times 10^{-4}$ |
| 26 | B | P | 1493 | 49 | 46 | 0.101 | $2.05 \times 10^{-5}$ | 2.64 | $1.9 \times 10^{-4}$ |
| 9 | C | N | — | — | 0 | 0.168 | $9.31 \times 10^{-6}$ | 10.2 | $3.0 \times 10^{-4}$ |
| 27 | C | N | 1553 | 49 | 16 | 0.141 | $1.03 \times 10^{-5}$ | 5.14 | $3.8 \times 10^{-4}$ |
| 28 | C | N | 1463 | 49 | 46 | 0.117 | $1.84 \times 10^{-5}$ | 2.98 | $2.5 \times 10^{-4}$ |
| 14 | D | N | — | — | 0 | 0.141 | $6.10 \times 10^{-6}$ | 5.10 | $6.4 \times 10^{-4}$ |
| 29 | D | N | 1503 | 49 | 14 | 0.127 | $6.74 \times 10^{-6}$ | 3.42 | $7.0 \times 10^{-4}$ |
| 30 | D | N | 1423 | 49 | 40 | 0.107 | $8.76 \times 10^{-6}$ | 2.78 | $4.7 \times 10^{-4}$ |
| 18 | D | N | 1403 | 49 | 43 | 0.101 | $9.04 \times 10^{-6}$ | 2.54 | $4.4 \times 10^{-4}$ |
| 31 | D | N | 1473 | 49 | 21 | 0.106 | $9.73 \times 10^{-6}$ | 4.14 | $2.8 \times 10^{-4}$ |

INDUSTRIAL APPLICABILITY

Silicon, the main component of the thermoelectric conversion material of the present invention, is an outstanding material in terms of protecting the global environment and conserving the earth's resources, and also affords excellent safety. Furthermore, it is light (has a low specific gravity), which makes it very favorable for thermoelectric conversion elements used in automobiles. Bulk silicon also has good corrosion resistance, which is an advantage in that no surface treatment or the like is needed.

Because it makes use of silicon as its main component, the thermoelectric conversion material of the present invention is less expensive than Si—Ge-based materials containing large quantities of costly germanium, and provides a higher Figure of merit than Fe—Si—based materials. Furthermore, the silicon used in the present invention is much lower in purity than that used in semiconductor devices, so the raw material is available at relatively low cost, the result of which is a thermoelectric conversion material with good productivity, stable quality, and low cost.

The thermoelectric conversion material of the present invention takes full advantage of the characteristics of silicon, namely, its low electrical resistance and large Seebeck coefficient despite having a large carrier concentration, and also greatly ameliorates its drawback of high thermal conductivity, and is therefore an effective way to obtain a material with a high Figure of merit. Another advantage is that the properties can be controlled by means of the type and amount of added elements.

As is clear from the examples, the thermoelectric conversion material of the present invention containing 5 to 10 at % of at least one of germanium, carbon, and tin has a Seebeck coefficient of ±2.0 to 4.0×10$^{-4}$ V/K, which means that the thermal conductivity of this novel silicon-based thermoelectric conversion can be greatly decreased to less than 50 W/m·K and the Figure of merit markedly enhanced without decreasing the Seebeck coefficient originally had by the material.

Also, as is clear from the examples, the thermoelectric conversion material of the present invention with a porosity of 5 to 40% has a Seebeck coefficient of 0.70 to 0.200 mV/K, which means that the thermal conductivity of this novel silicon-based thermoelectric conversion can be greatly decreased to less than 33 W/m·K and the figure of merit markedly enhanced without decreasing the Seebeck coefficient originally had by the material.

What is claimed is:

1. A thermoelectric conversion material having a polycrystal structure in which at least one added element is contained in an amount of 0.001 to 5 at % in silicon, and at least one said added element is deposited at boundaries between crystal grains formed of virtually all silicon.

2. A thermoelectric conversion material having a polycrystal structure in which at least one dopant that generates carriers is contained in an amount of 0.001 to 5 at % in silicon, and at least one said dopant is deposited at boundaries between crystal grains formed of virtually all silicon.

3. A thermoelectric conversion material having a polycrystal structure in which at least one dopant that generates carriers is contained in an amount of 0.0001 to 5 at % and at least one added element that does not generate carriers is contained in an amount of 0.1 to 10 at % silicon, and at least one of said added elements is deposited at boundaries between crystal grains in which virtually all silicon.

4. A thermoelectric conversion material having a polycrystal structure in which at least one added element that does not generate carriers is carriers is contained in an amount of 0.1 to 5 at % and at least one dopant that generates carriers is contained in an amounts of 0.001 to 5 at % in silicon, and at least one said added element is crystal grains formed of virtually all silicon.

5. The thermoelectric conversion material according to any one of claims 1 to 4, wherein, of the added elements, the one that generates carriers and is used to make a p-type semiconductor (dopant Ap) is one or more types selected from the group consisting of an Ap1 group (Be, Mg, Ca, Sr, Ba, Zn, Cd, Hg, B, Al, Ga, In, Tl) and transition metal elements $M_1$ (Y, Mo, Zr).

6. The thermoelectric conversion material according to any one of claims 1 to 4, wherein, of the added elements, the one that generates carriers and is used to make an n-type semiconductor (dopant An) is one or more types selected from the group consisting of An1 group (N, P, As, Sb, Bi, O, S, Se, Te), transition metal elements $M_2$ (Ti, V, Cr, Mn, Fe, Co, Ni, Cu, Nb, Ru, Rh, Pd, Ag, Hf, Ta, W, Re, Os, Ir, Pt, Au; where Fe accounts for 5 at % or less), and rare earth elements Re (La, Ce, Pr, Nd, Pm, Sm, Eu, Gd, Tb, Dy, Ho, Er, Yb, Lu).

7. The thermoelectric conversion material according to any one of claims 1, 3, and 4, wherein, of the added elements, the one that does not generate carriers is one more types selected from the group consisting of Group IV elements other than silicon, Group II–V compounds semiconductors, and Group II–Vi compound semiconductors.

8. The thermoelectric conversion material according to any one of claims 1 to 4, wherein the material is an ingot quenched from a melt, sinter, a heat treated laminate, or a material having a porosity of 5 to 40%.

9. The thermoelectric conversion material according to claim 8, wherein the material consists of a p-type or n-type semiconductor material whose carrier concentration is $10^{17}$ to $10^{21}$ (M/m$^3$) and whose thermal conductivity is no more than 50 W/m·K.

10. The thermoelectric conversion material according to claim 8, wherein the added element that does not generate carriers is germanium, and the carrier concentration in the semiconductor is $10^{19}$ to $10^{21}$ (M/m$^3$).

11. A method for manufacturing the thermoelectric conversion material according to any one of claims 1 to 4, including a step of cooling a melt such that added elements are contained in silicon, and with which a crystal structure is obtained in which at least one type of added element is deposited at boundaries between crystal grains formed of virtually all silicon.

12. The method for manufacturing a thermoelectric conversion material according to claim 11, wherein the melting is arc melting or high-frequency melting.

13. The method for manufacturing a thermoelectric conversion material according to claim 11, wherein the melting and cooling are accomplished by CZ method, FZ method, or ZL method.

14. A method for manufacturing thermoelectric conversion material according to any one of claims 1 to 4, including a step of powderizing a material containing an added element in silicon, and a step of sintering the powder, and with which a crystal structure is obtained in which at least one type of added element is deposited on crystal grains formed of virtually all silicon.

15. A method for manufacturing the thermoelectric conversion material according to claims 1 to 4, including a step of cooling a melt such that added elements are contained in silicon, a step of powderizing the material thus obtained, and a step of sintering the powder, and with which a crystal structure is obtained in which at least one type of added element is deposited on crystal grains formed of virtually all silicon.

16. A method for manufacturing a thermoelectric conversion material according to claim 15, wherein a powder with an average crystal grain diameter of 1 to 50 µm and an average particle diameter of 3 to 100 µm is sintered.

17. A method for manufacturing the thermoelectric conversion material according to any one of claims 1 to 4, including a step of coating a silicon powder with an added element or embedding the latter in the former, and a step of sintering the silicon powder, and with which a crystal structure is obtained in which at least one type of added element is deposited at boundaries between crystal grains formed of virtually all silicon.

18. A method for manufacturing a thermoelectric conversion material according to claim 17, wherein the added element is contained in the silicon powder itself.

19. A method for manufacturing a thermoelectric conversion material according to claim 17, wherein the coating step is a vapor phase growth process or a discharge plasma treatment.

20. A method for manufacturing a thermoelectric conversion material according to claim 17, wherein the embedding step is mechanofusion treatment.

21. A method for manufacturing the thermoelectric conversion material according to any one of claims 1 to 4, including a step of forming and laminating layers of silicon or including silicon and layers including added elements, either alternately or in the required pattern, and a step of subjecting the laminated area to a heat treatment, and with which a crystal structure is obtained in which at least one type of added element is deposited at boundaries between crystal grains formed of virtually all silicon.

22. A method for manufacturing the thermoelectric conversion material according to any one of claims 1 to 4, including a step of cooling a melt such that added elements are contained in silicon, a step powderizing the material thus obtained, and a step of subjecting a powder to hot pressing or discharge plasma sintering to adjust the porosity to between 5 and 40%, and with which a crystal structure is obtained in which at least one type of added element is deposited at boundaries between crystal grains formed of virtually all silicon.

* * * * *